United States Patent
Glover et al.

(10) Patent No.: US 11,993,977 B2
(45) Date of Patent: *May 28, 2024

(54) ADJUSTABLE FRAME WITH A THERMAL BREAK SEAL

(71) Applicant: AADG, INC., New Haven, CT (US)

(72) Inventors: Daniel Brian Glover, Franklin, TN (US); Patrick Middleton, Medina, TN (US); Michael Scheve, Wheeling, IL (US); Walter Ford, Swansea, IL (US)

(73) Assignee: AADG, INC., New Haven, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/831,659

(22) Filed: Jun. 3, 2022

(65) Prior Publication Data

US 2022/0389749 A1    Dec. 8, 2022

Related U.S. Application Data

(60) Provisional application No. 63/278,513, filed on Nov. 12, 2021, provisional application No. 63/278,515, (Continued)

(51) Int. Cl.
*E06B 1/20*    (2006.01)
*E06B 1/52*    (2006.01)
(Continued)

(52) U.S. Cl.
CPC ............... *E06B 7/16* (2013.01); *E06B 1/20* (2013.01); *E06B 1/52* (2013.01); *E06B 1/6015* (2013.01);
(Continued)

(58) Field of Classification Search
CPC ..... E06B 1/20; E06B 1/10; E06B 1/18; E06B 1/30; E06B 1/325; E06B 3/26301;
(Continued)

(56) References Cited

U.S. PATENT DOCUMENTS 2,860,744 A * 11/1958 Mascari .................... E06B 1/20
52/212
3,248,833 A * 5/1966 Sklar ...................... E06B 1/6061
52/211
(Continued)

FOREIGN PATENT DOCUMENTS

CA    3062210 A1    5/2021

OTHER PUBLICATIONS

AADG, Inc., Canadian Patent Application No. 3,161,745, Office Action, Oct. 27, 2023.

*Primary Examiner* — Kyle J. Walraed-Sullivan
(74) *Attorney, Agent, or Firm* — Moore & Van Allen PLLC; Jeffrey R. Gray

(57)    ABSTRACT

A frame may include three or more portions having an upper portion disposed adjacent an upper end of an opening and two side portions disposed along either edge of the opening, and in some cases a lower portion when the opening is for a window or some doors. A first frame segment and the second frame segment are adjustable with respect to each other in order to extend around the thickness of the door opening. The segments may have one or more thermal barriers, such as a seal (e.g., u-shaped, v-shaped, or the like seal) located between portions of the segments. The first frame segment may be adjusted with respect to the second frame segment. The adjustment of the segments may be made before or after the one or more thermal barriers are installed.

20 Claims, 19 Drawing Sheets

Related U.S. Application Data filed on Nov. 12, 2021, provisional application No. 63/276,230, filed on Nov. 5, 2021, provisional application No. 63/276,227, filed on Nov. 5, 2021, provisional application No. 63/197,770, filed on Jun. 7, 2021.

(51) Int. Cl.
| | |
|---|---|
| *E06B 1/60* | (2006.01) |
| *E06B 1/62* | (2006.01) |
| *E06B 3/263* | (2006.01) |
| *E06B 3/46* | (2006.01) |
| *E06B 7/16* | (2006.01) |
| *H05K 9/00* | (2006.01) |

(52) U.S. Cl.
CPC ............ *E06B 1/62* (2013.01); *E06B 3/26301* (2013.01); *E06B 3/26336* (2013.01); *E06B 3/4636* (2013.01); *H05K 9/0003* (2013.01); *H05K 9/0081* (2013.01); *E06B 2001/622* (2013.01); *E06B 2003/2635* (2013.01)

(58) Field of Classification Search
CPC ............... E06B 3/2063; E06B 3/26305; E06B 3/26307; E06B 2003/26316; E06B 3/26336
USPC ...................... 52/212, 217; 49/505
See application file for complete search history.

(56) References Cited

U.S. PATENT DOCUMENTS

| | | | | |
|---|---|---|---|---|
| 3,420,003 | A * | 1/1969 | Cline .................. | E06B 1/20 49/505 |
| 3,571,995 | A * | 3/1971 | Kasprzak ............ | E06B 1/20 49/505 |
| 3,609,928 | A | 10/1971 | Mock | |
| 3,654,734 | A * | 4/1972 | Lehman .............. | E06B 1/20 49/505 |
| 3,788,019 | A * | 1/1974 | Kiselewski ......... | E06B 1/6023 52/214 |
| 3,793,788 | A * | 2/1974 | Collins ............... | E06B 1/20 52/214 |
| 3,906,671 | A * | 9/1975 | Maldonado ......... | E06B 1/20 49/505 |
| 4,018,022 | A * | 4/1977 | Fink ................... | E06B 3/26336 52/204.593 |
| 4,642,954 | A * | 2/1987 | Sigerist ............... | E06B 1/34 52/211 |
| 4,674,248 | A * | 6/1987 | Hall .................... | E06B 1/12 49/504 |
| 4,705,916 | A | 11/1987 | Wadhera et al. | |
| 4,735,025 | A * | 4/1988 | Day .................... | E06B 1/20 52/217 |
| 4,782,630 | A * | 11/1988 | Kleyn ................. | E06B 1/20 49/505 |
| 4,791,758 | A * | 12/1988 | Bauer ................. | E06B 1/20 49/505 |
| 4,878,325 | A * | 11/1989 | Van Tuyl ............ | E06B 1/20 49/505 |
| 4,986,034 | A * | 1/1991 | Mozuras ............. | E06B 1/20 49/505 |
| 5,070,651 | A | 12/1991 | Jeter | |
| 5,187,898 | A * | 2/1993 | McKann .............. | E06B 1/20 49/505 |
| 5,220,748 | A * | 6/1993 | Chadbourne ........ | E06B 1/64 49/505 |
| 5,233,802 | A * | 8/1993 | Rogers ................ | E06B 1/20 49/505 |
| 5,294,270 | A | 3/1994 | Fenical | |
| 5,345,722 | A * | 9/1994 | McKann .............. | E06B 1/20 49/505 |
| 5,392,574 | A | 2/1995 | Sayers | |
| 5,412,909 | A | 5/1995 | Wu | |
| 6,050,036 | A | 4/2000 | Frey | |
| 6,282,851 | B1 * | 9/2001 | Beaton ................ | E06B 1/12 49/505 |
| 6,639,145 | B1 | 10/2003 | Nurmi | |
| 7,340,866 | B1 | 3/2008 | Smith | |
| 8,650,818 | B1 * | 2/2014 | Smith ................. | E06B 1/603 52/211 |
| 9,115,501 | B2 * | 8/2015 | Rucinski ............. | E06B 1/6023 |
| 10,851,572 | B1 | 12/2020 | Flynn | |
| 11,286,712 | B2 * | 3/2022 | MacDonald ......... | E06B 1/08 |
| 2007/0022699 | A1 * | 2/2007 | Wang .................. | E06B 1/30 52/656.4 |
| 2009/0077912 | A1 * | 3/2009 | Yeremian ............ | E06B 5/003 52/745.15 |
| 2010/0212239 | A1 * | 8/2010 | Wang .................. | E06B 1/30 52/217 |
| 2011/0179730 | A1 * | 7/2011 | Kolovich ............. | E06B 1/6046 52/204.2 |
| 2013/0192163 | A1 * | 8/2013 | Tatrault .............. | E04C 3/09 52/741.1 |
| 2018/0038149 | A1 | 2/2018 | Strickland et al. | |
| 2019/0128048 | A1 * | 5/2019 | MacDonald ......... | E06B 1/32 |
| 2021/0047880 | A1 | 2/2021 | Gosling et al. | |
| 2021/0324675 | A1 * | 10/2021 | Liang ................. | E04D 13/0305 |
| 2022/0389748 | A1 | 12/2022 | Glover et al. | |
| 2022/0389750 | A1 | 12/2022 | Glover et al. | |
| 2022/0389757 | A1 * | 12/2022 | Glover ................ | E06B 1/045 |

\* cited by examiner

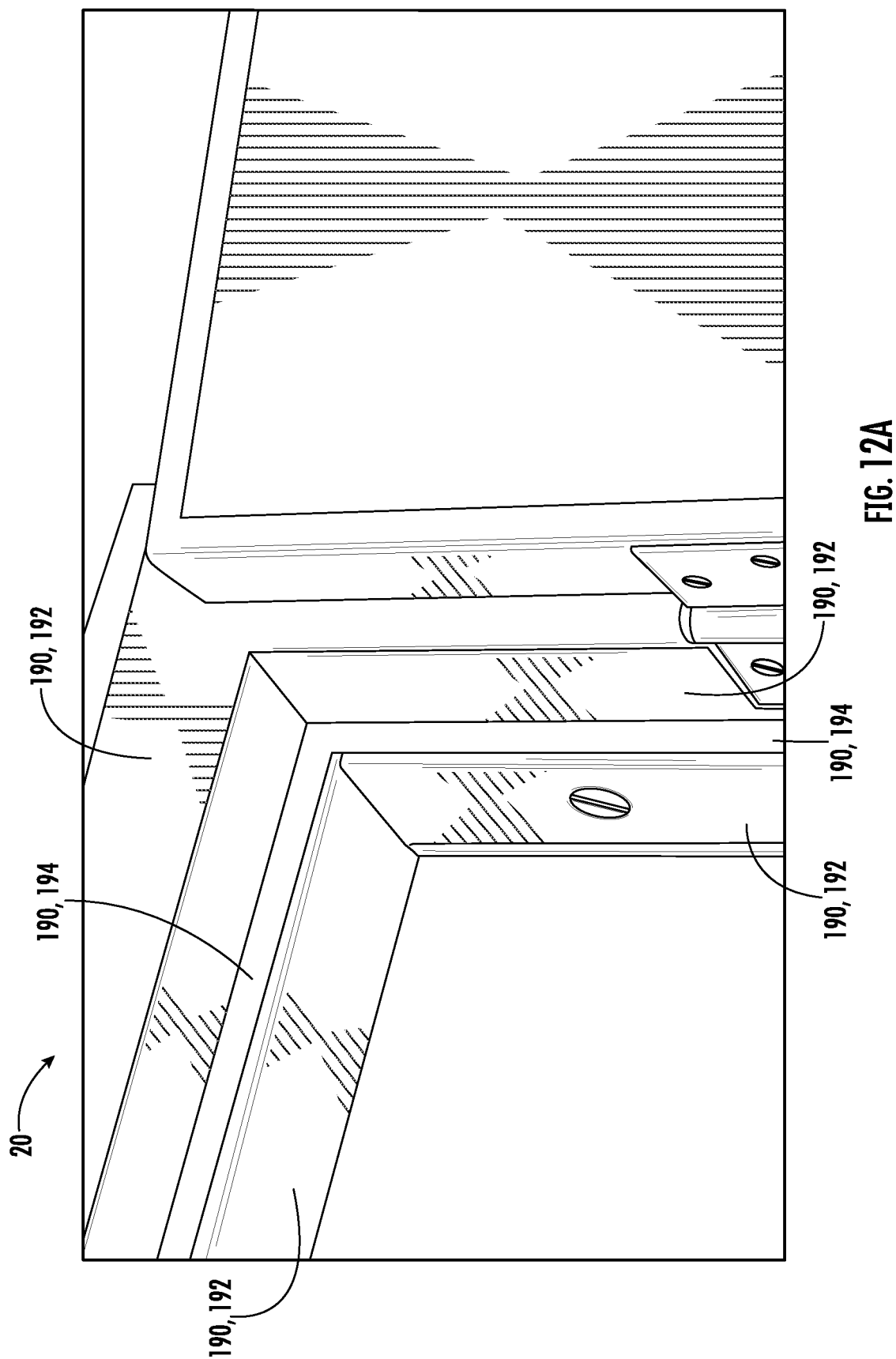

ADJUSTABLE FRAME WITH A THERMAL BREAK SEAL

CROSS REFERENCE AND PRIORITY CLAIM UNDER 35 U.S.C. § 119

The present Application for a Patent claims priority to U.S. Provisional Patent Application Ser. No. 63/278,515 entitled "Adjustable Door Frame for a Sliding Door" filed on Nov. 12, 2021, U.S. Provisional Patent Application Ser. No. 63/278,513 entitled "Security Features for a Sliding Door System" filed on Nov. 12, 2021, U.S. Provisional Patent Application Ser. No. 63/276,227 entitled "Adjustable Frame with a Thermal Break Seal" filed on Nov. 5, 2021, U.S. Provisional Patent Application Ser. No. 63/276,230 entitled "Adjustable Frame With a Thermal Break" filed on Nov. 5, 2021, U.S. Provisional Patent Application Ser. No. 63/197,770 entitled "Adjustable Door Frame With a Thermal Break" filed on Jun. 7, 2021, all of which are assigned to the assignees hereof and hereby expressly incorporated by reference herein.

FIELD

Embodiments of the present disclosure generally relate to door frames for a door opening, and in particular, to adjustable door frames having a thermal break to reduce conductive heat losses and air infiltration/exfiltration from one side of the door frame to the other, and for assembly of the door frames with walls of different thicknesses.

BACKGROUND

Common door openings are subject to thermal and/or air leakage, which results in higher energy costs for building owners. Moreover, walls within a building, such as within individual rooms, between rooms, and/or between floors may be of different sizes, and thus, require different door frames.

SUMMARY

As will be described herein, embodiments of the door frame may comprise three or more portions comprising an upper portion disposed adjacent an upper end of a door opening and two side portions disposed along either edge of the door opening (e.g., three portions for a door opening, four portions for a window opening, in some cases a door opening, or the like). One side portion may be located on the hinge side of the door and the opposite side portion may be located on the latch side of the door. Each of the door frame portions may be made up of a pair of elongated frame segments of sufficient length to fit the door opening and door. The frame segments are assembled around the opening edges a of wall. A first frame segment may be disposed on the outer side of the door opening (e.g., the side of wall that is normally outside of the door), and second frame segment may be disposed on the inner side of the door opening (e.g., the side of the wall that is normally enclosed by the door). However, in some embodiments the first frame segment may be disposed on the inner side of the door opening and the second frame segment may be disposed on the outer side of the door opening. The frame portions may be secured to each other and the adjoining structure by frame connectors (e.g., clips, tabs, fasteners, and/or the like). A door may be hung conventionally within the door opening by hinges secured by fasteners through openings to hinge reinforcements in one (a single hinged door) or both (for a double door) of the frame side portions so that the door face contacts stop flanges of the door frame. The door may be any type of conventional door, any customized door, or the like.

The first frame segment may have one or more first adjustment members and/or the second frame segment may have one or more second adjustment members. The first adjustment members and/or the second adjustment members may allow the adjustment between the first frame segment and the second frame segment in order to extend around the thickness of the door opening. In some embodiments the first frame segment and the second frame segment are both utilize the adjustment members (e.g., welded to the first frame segment and the second frame segment, respectively), and are operatively coupled to each other (e.g., slidably operatively coupled) to adjust the width of the door frame. The segments may be operatively coupled together through the use of one or more segment connectors (e.g., clips, tabs, fasteners, and/or the like) and/or through the use of the one or more first adjustment members and/or the second adjustment members.

Moreover, the first frame segment and/or the second frame segment may have one or more barriers (e.g., thermal and/or air infiltration/exfiltration barriers) in the form of a coating, strip, or elongated seals having a first leg, a second leg, and a connecting member (e.g., u-shaped, v-shaped, or the like) located between flanges and surfaces of the first frame segment and the second frame segment. The barriers (e.g., coating, seals, or the like) may be installed before or after the first frame segment and the second frame segment are adjusted for the thickness of the door opening.

One embodiment of the invention is a frame for an opening. The frame comprises at least one first frame segment and at least one second frame segment. The at least one first frame segment is adjustable with respect to the at least one second frame segment.

In further accord with embodiments, the frame further comprises one or more thermal barriers between a portion of the at least one first frame segment and a portion of the at least one second frame.

In other embodiments, the frame further comprises one or more thermal barriers between a portion of the at least one first frame segment and a portion of the at least one second frame segment.

In still other embodiments, the one or more thermal barriers comprise a seal. The seal comprises a first leg, a second leg, and a connecting member operatively coupling the first leg and the second leg.

In yet other embodiments, the seal comprises a u-shaped or v-shaped seal.

In other embodiments, the frame further comprises one or more adjustment members operatively coupled to the at least one first frame segment or the at least one second frame segment.

In further accord with embodiments, the one or more adjustment members comprise one or more first adjustment members operatively coupled to the at least one first frame segment, and one or more second adjustment members operatively coupled to the at least one second frame segment. The at least one first frame segment is adjustable with respect to the at least one second frame segment through the one or more first adjustment members and the one or more second adjustment members.

In other embodiments, the one or more first adjustment members and the one or more second adjustment members are slidably operatively coupled to each other.

In yet other embodiments, the one or more adjustment members comprise a first section, a second section, and one or more apertures in the first section or the second section.

In still other embodiments, the one or more adjustment members comprise an L-shaped adjustment member having the first section and the second section.

In other embodiments, the frame further comprises one or more adjustment connectors. The one or more adjustment connectors operatively couple the one or more adjustment members to the at least one first frame segment, the at least one second frame segment, or to each other when there are two or more adjustment members.

In further accord with embodiments, the one or more thermal barriers comprise a first segment thermal barrier operatively coupled to a first segment flange of the at least one first frame segment and engaging an inner surface of the at least one second frame segment. The one or more thermal barriers further comprise a second segment thermal barrier operatively coupled to a second segment flange of the at least one second frame segment and engaging an outer surface of the at least one first frame segment.

In other embodiments, the first segment flange is a first segment stop flange and the inner surface is on a soffit inner face. The second segment flange is a soffit stop flange and the outer surface is on a first jamb flange.

In yet other embodiments, the at least one first frame segment comprises a first molding flange, a first jamb flange adjacent to the first molding flange, and a first stop flange adjacent to the first jamb flange.

In still other embodiments, the at least one second frame segment comprises a second molding flange, a second jamb flange adjacent to the second molding flange, a second stop flange adjacent to the second jamb flange, a soffit face adjacent to the second stop flange, and a soffit stop flange adjacent the soffit face.

Another embodiment of the invention comprises a frame comprising at least one first frame segment for an upper portion or side portions of the opening, the at least one first frame segment having a first molding flange, a first jamb flange adjacent to the first molding flange, and a first stop flange adjacent to the first jamb flange. The at least one second frame segment for the upper portion or the side portions of the opening, the at least one second frame segment having a second molding flange, a second jamb flange adjacent to the second molding flange, a second stop flange adjacent to the second jamb flange, a soffit face adjacent to the second stop flange, and a soffit stop flange adjacent the soffit face. One or more adjustment members are operatively coupled to the first frame segment or the second frame segment, and the at least one first frame segment is adjustable with respect to the at least one second frame segment through the one or more adjustment members.

In further accord with embodiments, the frame further comprises one or more thermal barriers between a first segment stop flange and an inner surface of a soffit inner face, or between a soffit stop flange and an outer surface of a first jamb flange.

In yet other embodiments, the one or more thermal barriers comprise a seal. The seal comprises a first leg, a second leg, and a connecting member operatively coupling the first leg and the second leg.

In still other embodiments, the frame further comprises one or more adjustment members operatively coupled to the at least one first frame segment or the at least one second frame segment.

Another embodiment of the invention comprises a method of forming a frame. The method comprises adjusting at least one first frame segment with respect to at least one second frame segment through the use of one or more adjustment members. The method further comprises securing the at least one first frame segment to the at least one second frame segment through the use of one or more adjustment connectors.

In further accord with embodiments, the method further comprises applying one or more barriers between the least one first frame segment and the at least one second frame segment.

To the accomplishment the foregoing and the related ends, the one or more embodiments comprise the features hereinafter described and particularly pointed out in the claims. The following description and the annexed drawings set forth certain illustrative features of the one or more embodiments. These features are indicative, however, of but a few of the various ways in which the principles of various embodiments may be employed, and this description is intended to include all such embodiments and their equivalents.

BRIEF DESCRIPTION OF THE DRAWINGS

Having thus described embodiments of the invention in general terms, reference will now be made to the accompanying drawings.

Figure 1A:
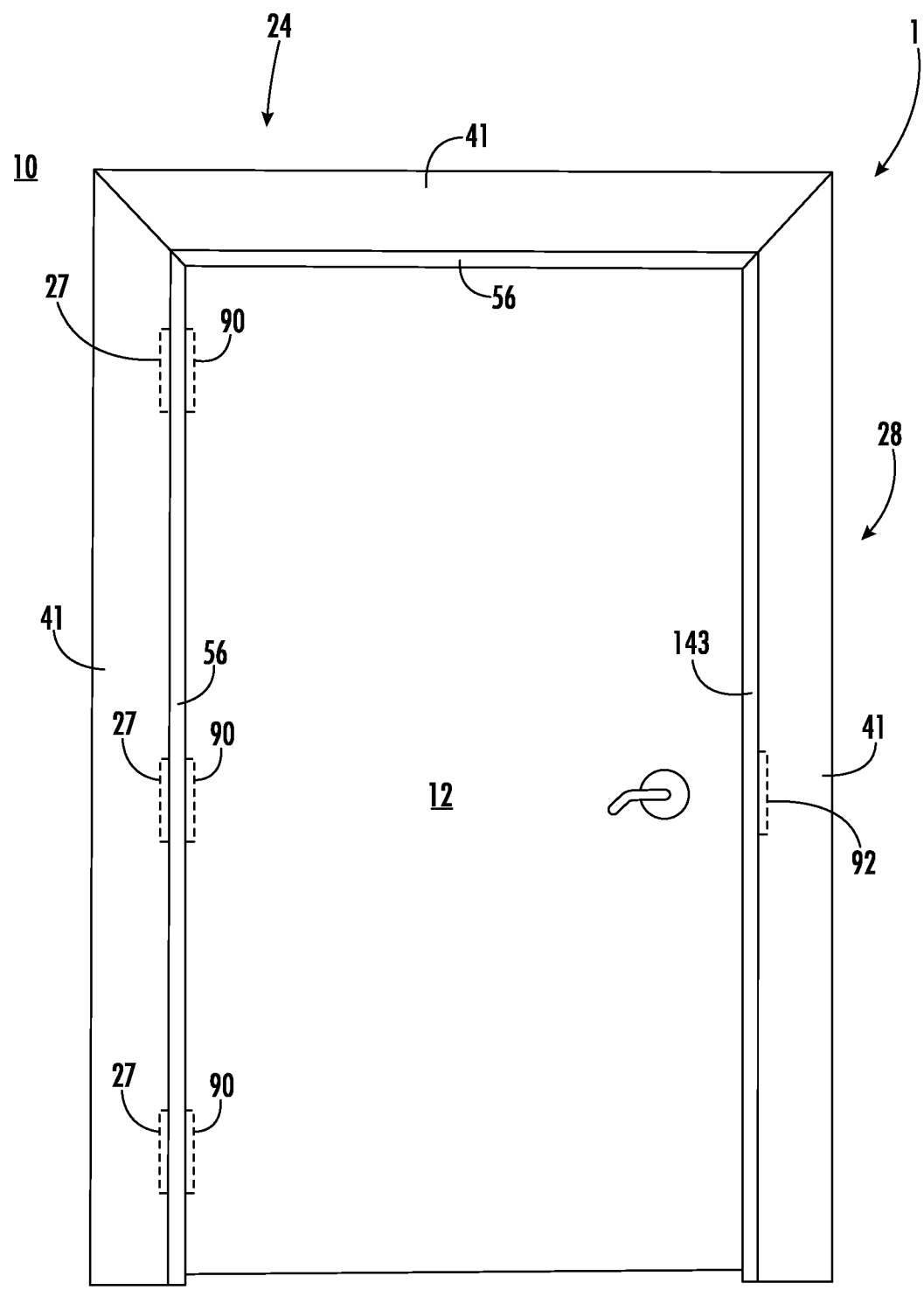

FIG. 1A is front view of one side of the assembled door frame and door, in accordance with some embodiments of the disclosure.

Figure 1B:
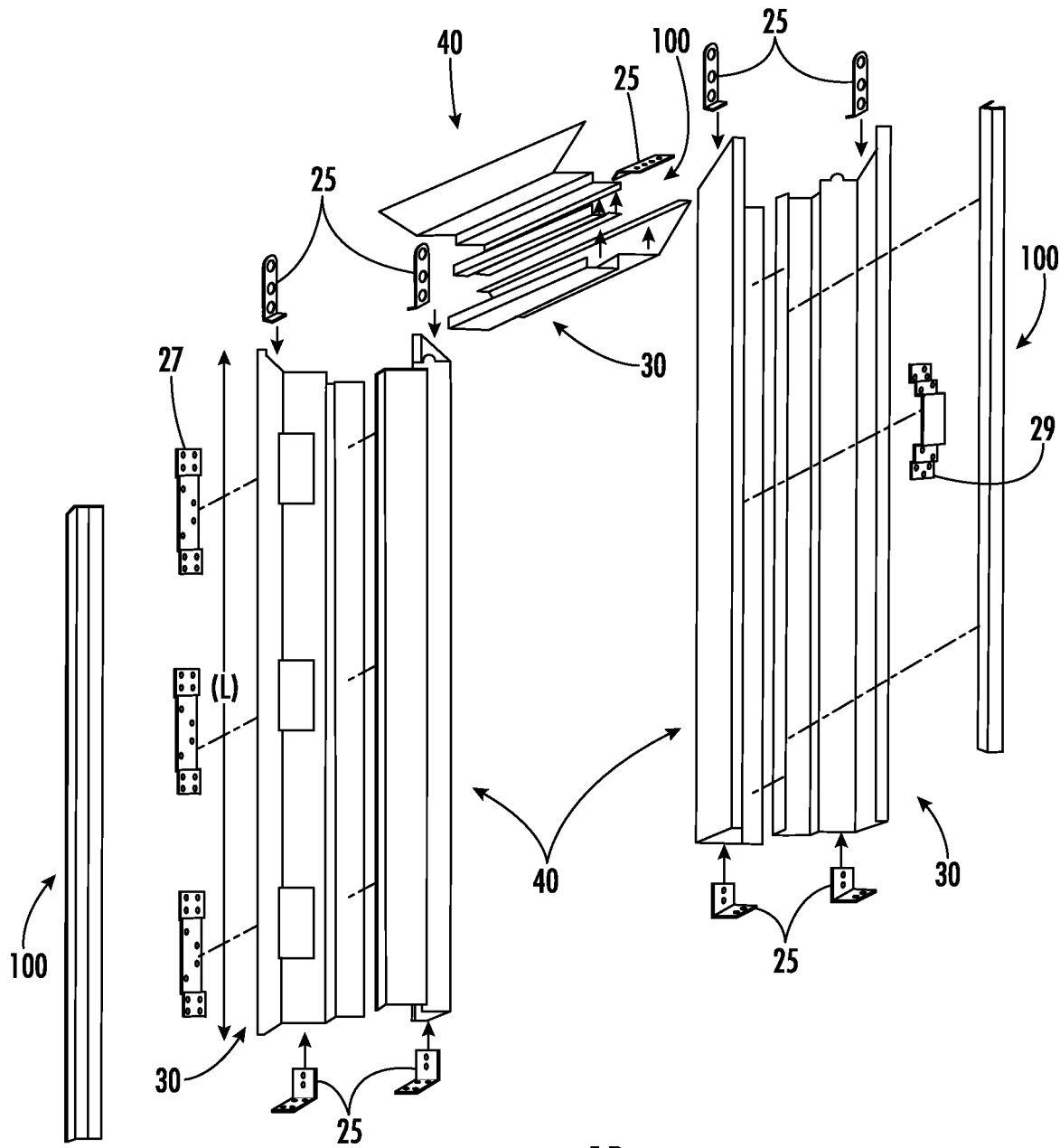

FIG. 1B is an exploded perspective view of a portion of a door frame, in accordance with some embodiments of the disclosure.

Figure 2:
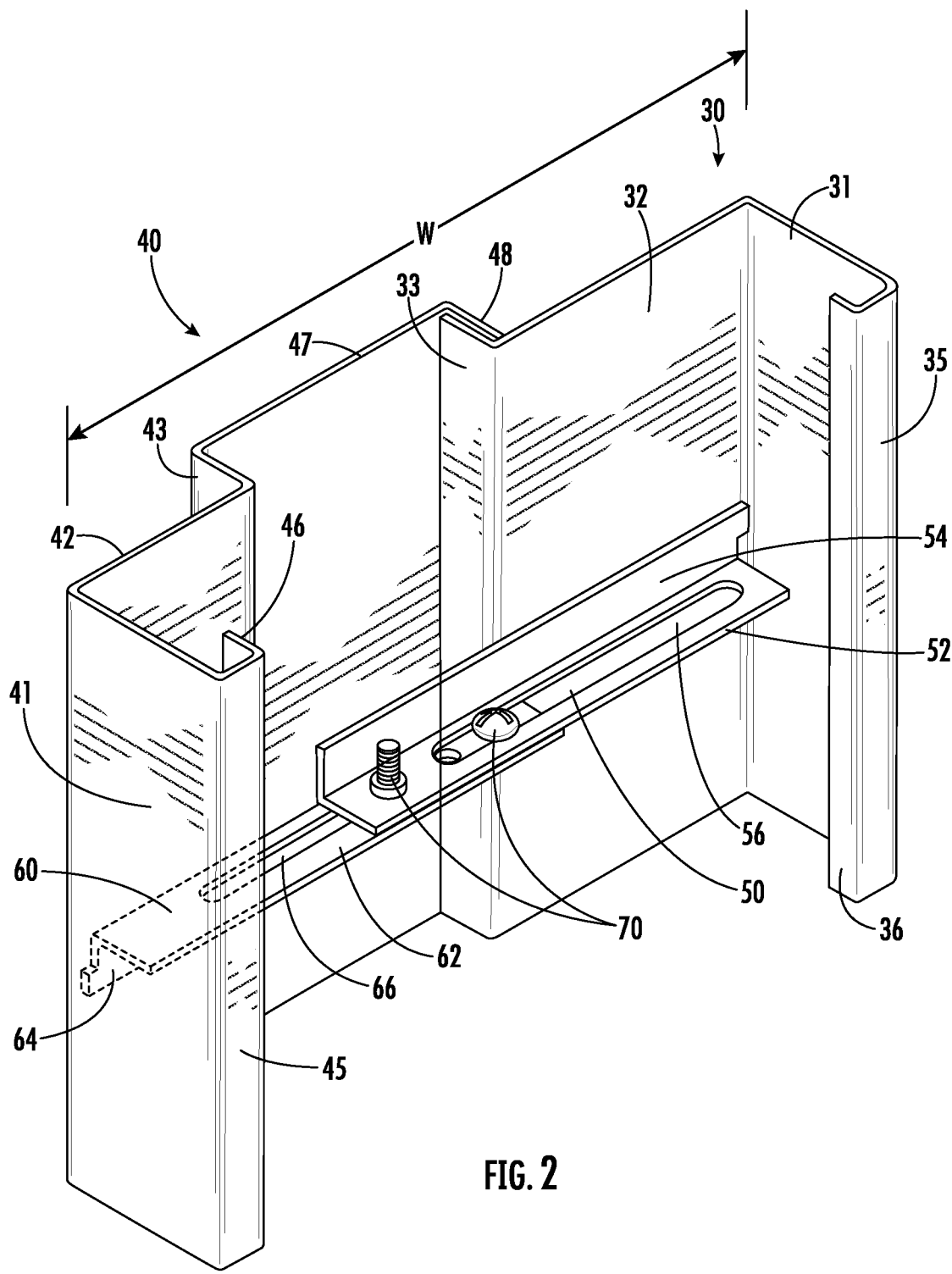

FIG. 2 is a rear perspective view of a part of the door frame, in accordance with some embodiments of the disclosure.

Figure 3:
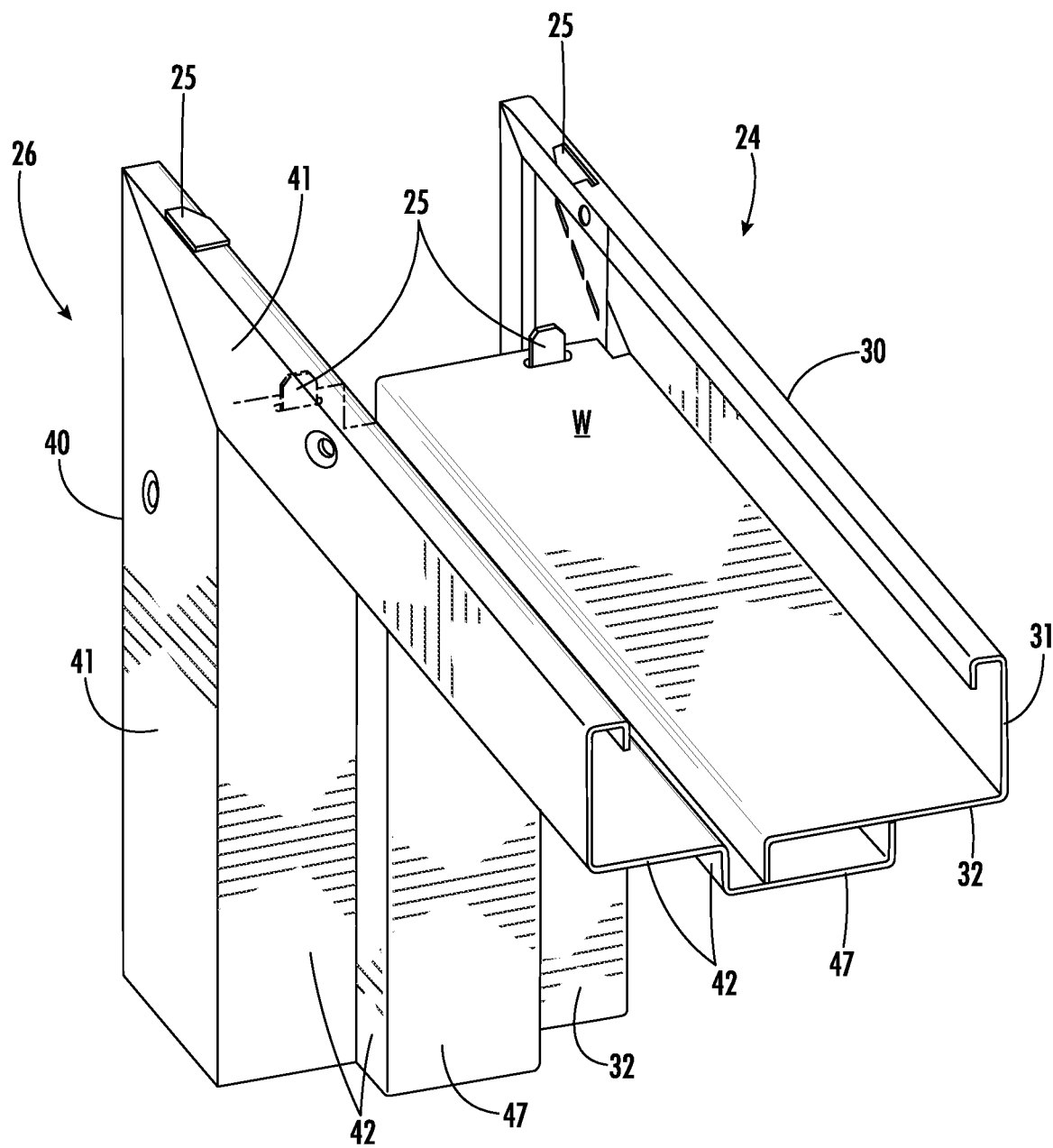

FIG. 3 illustrates part of the top portion and side portion of the adjustable door frame, in accordance with some embodiments of the disclosure.

Figure 4C:
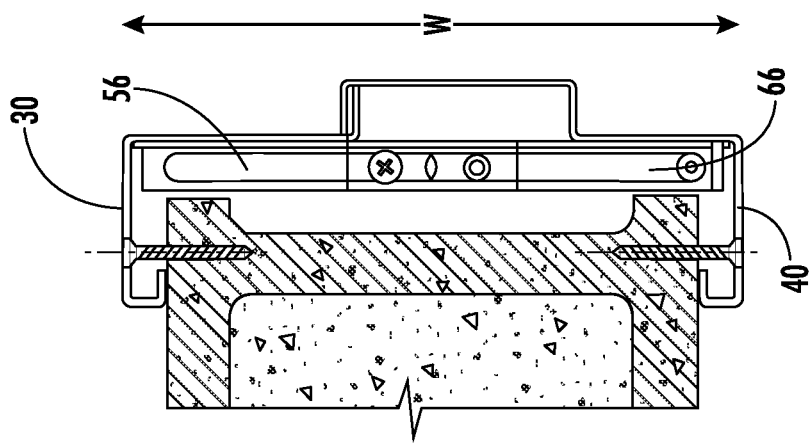
Figure 4B:
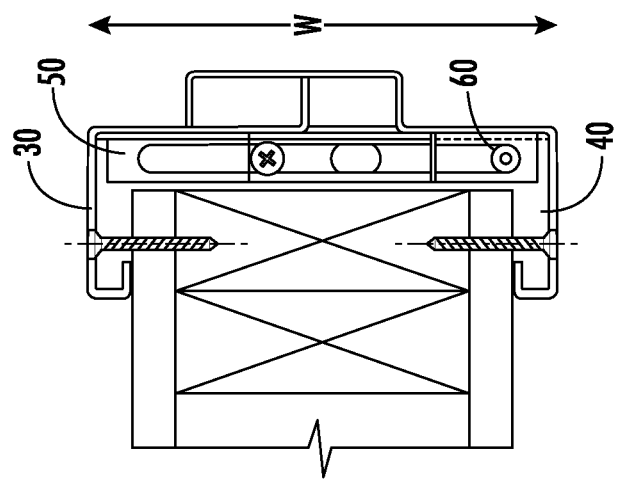
Figure 4A:
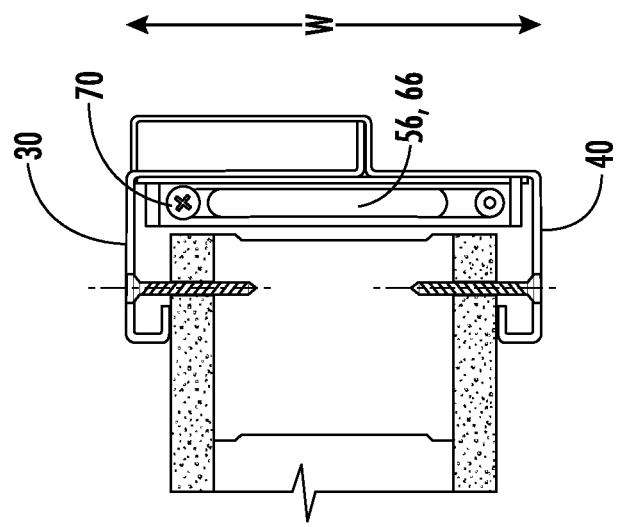

FIG. 4A is a top view of a portion of the door frame installed on a wall of a door opening in the minimum width position, in accordance with some embodiments of the disclosure.

FIG. 4B is a top view of a portion of the door frame installed on a wall of a door opening in an intermediate width position, in accordance with some embodiments of the disclosure.

FIG. 4C is a top view of a portion of the door frame installed on a wall of a door opening in a maximum width position, in accordance with some embodiments of the disclosure.

Figure 5A:
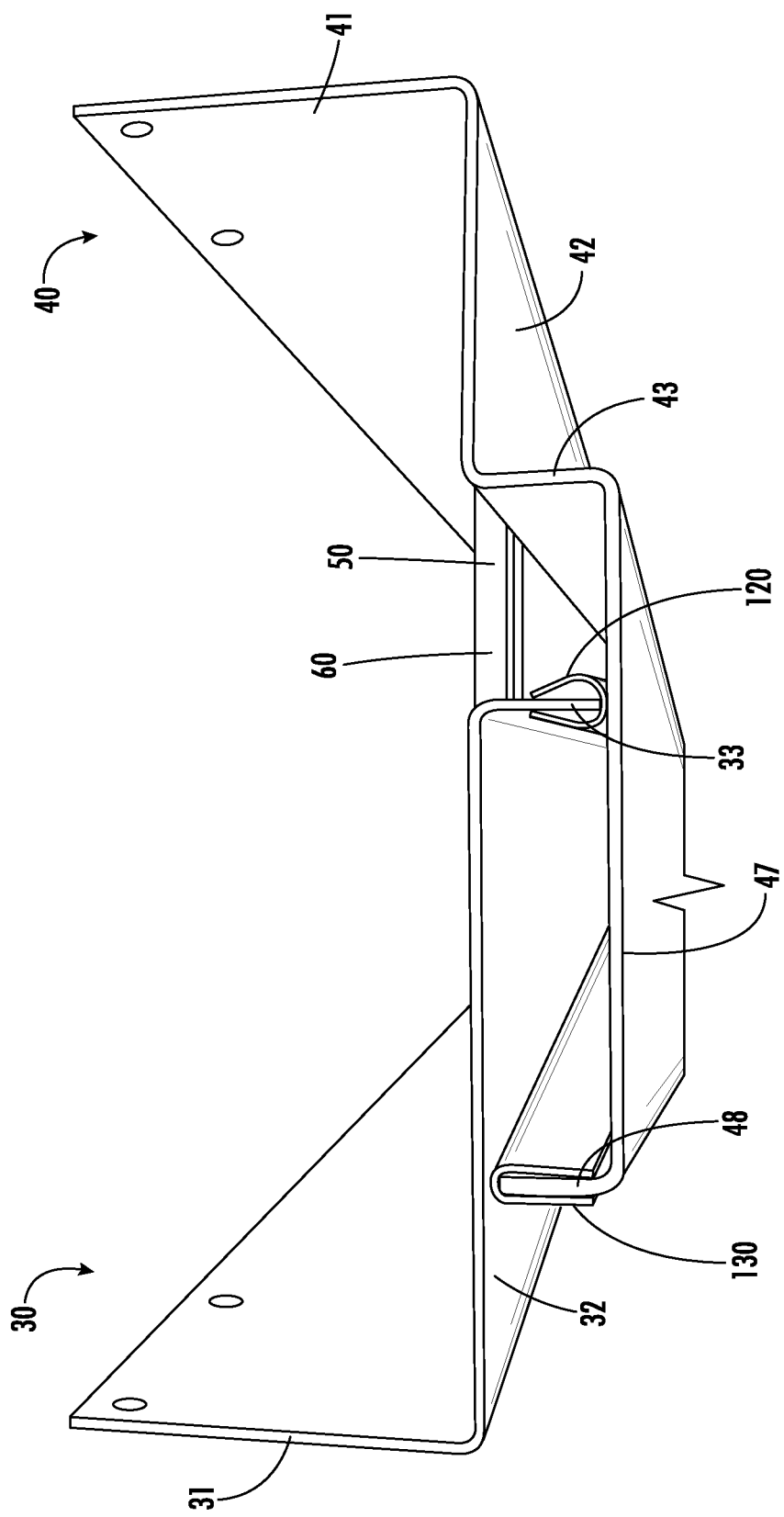

FIG. 5A is a top perspective view of a part of the door frame with the seal installed, in accordance with some embodiments of the disclosure.

Figure 5B:
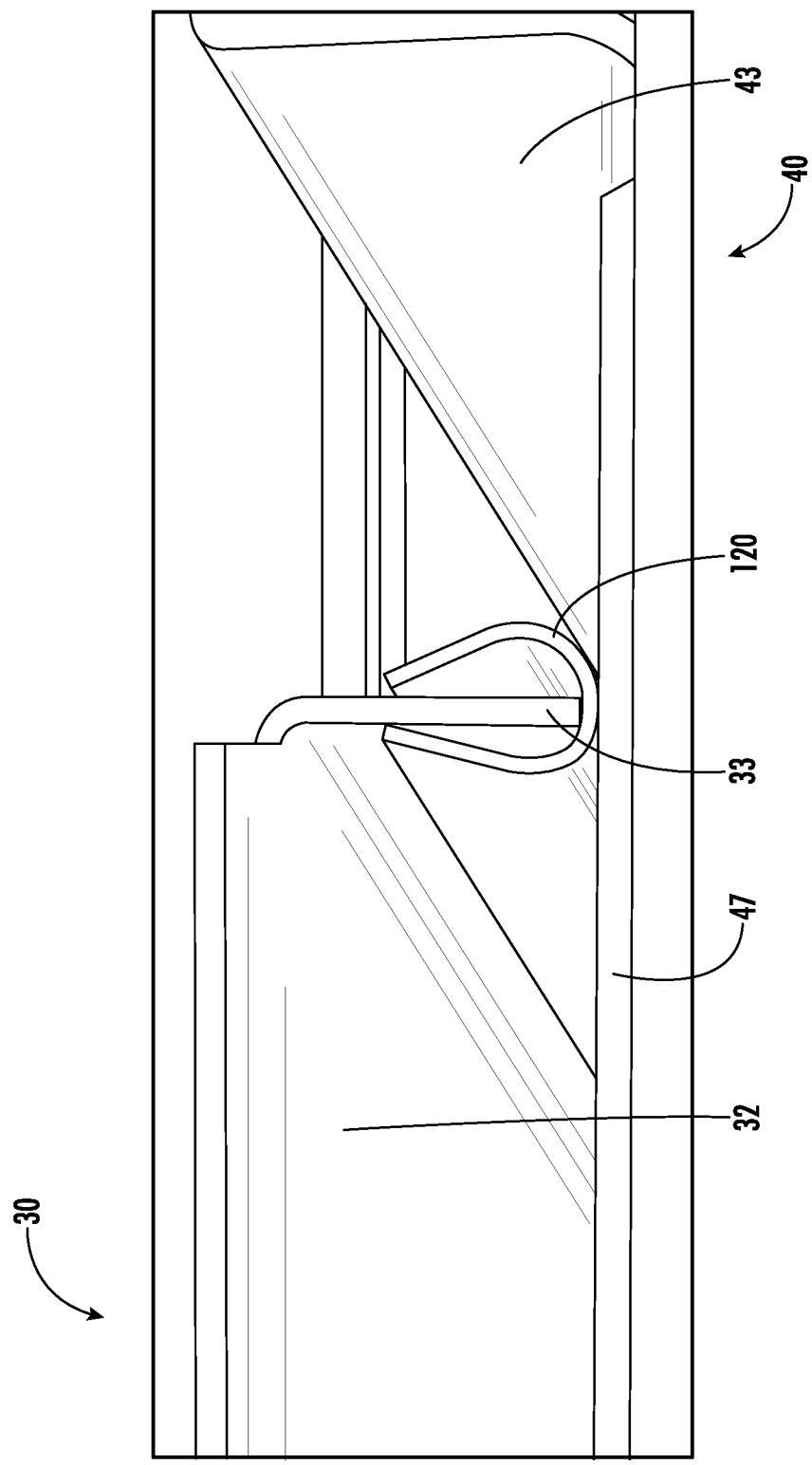

FIG. 5B is an enlarged top perspective view of a part of the door frame with the seal installed, in accordance with some embodiments of the disclosure.

Figure 6:
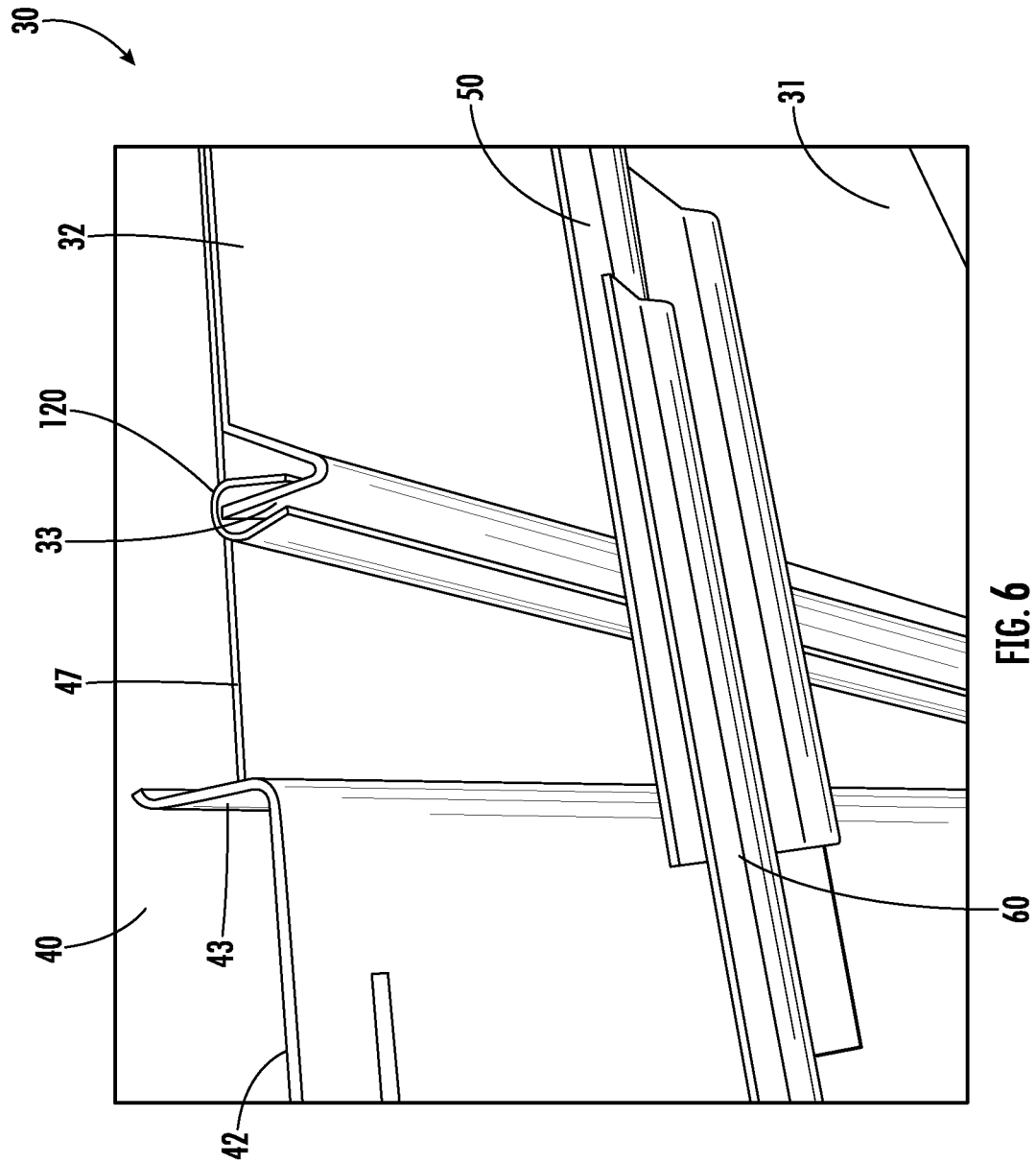

FIG. 6 is a rear perspective view of a part of the door frame with the seal installed, in accordance with some embodiments of the disclosure.

Figure 7A:
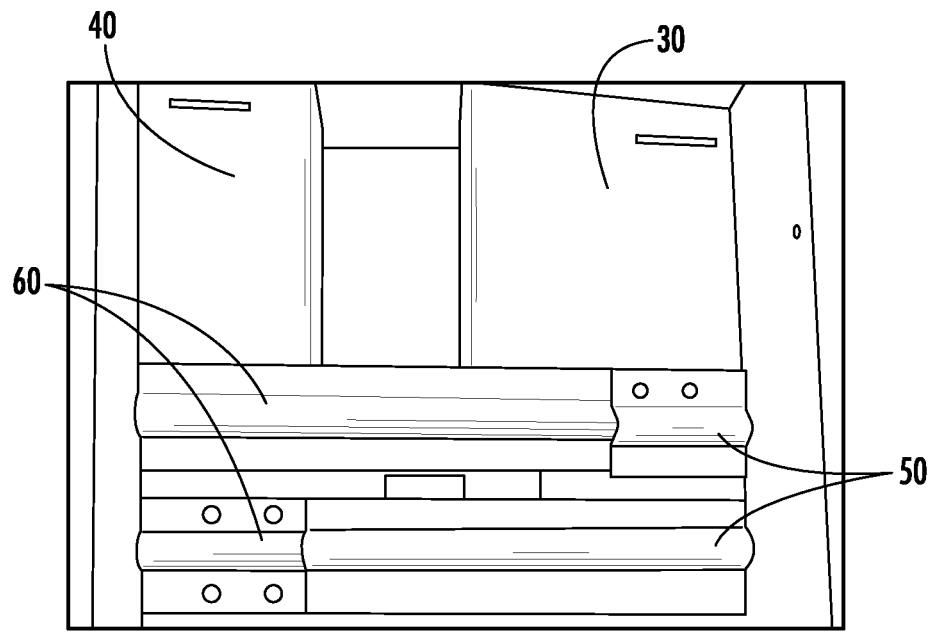

FIG. 7A is a rear perspective view of a part of the door frame without the thermal barriers installed between the adjustment members, in accordance with some embodiments of the disclosure.

Figure 7B:
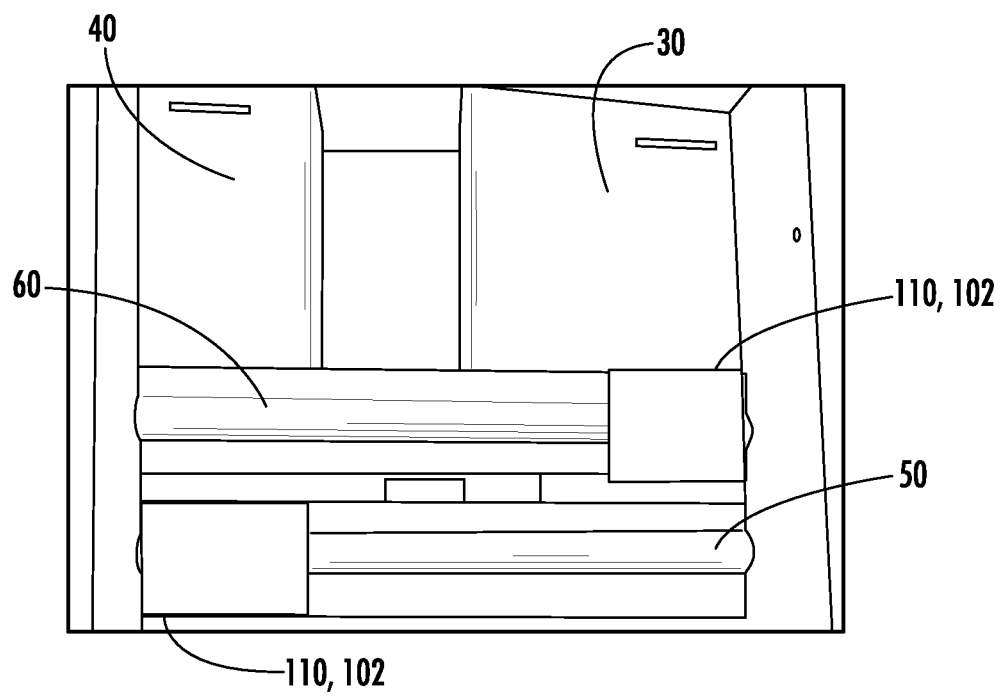

FIG. 7B is a rear perspective view of a part of the door frame with thermal barriers installed between the adjustment members, in accordance with some embodiments of the disclosure.

Figure 8B:
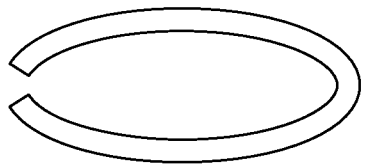
Figure 8C:
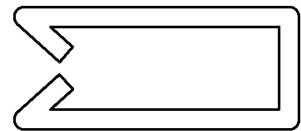
Figure 8A:
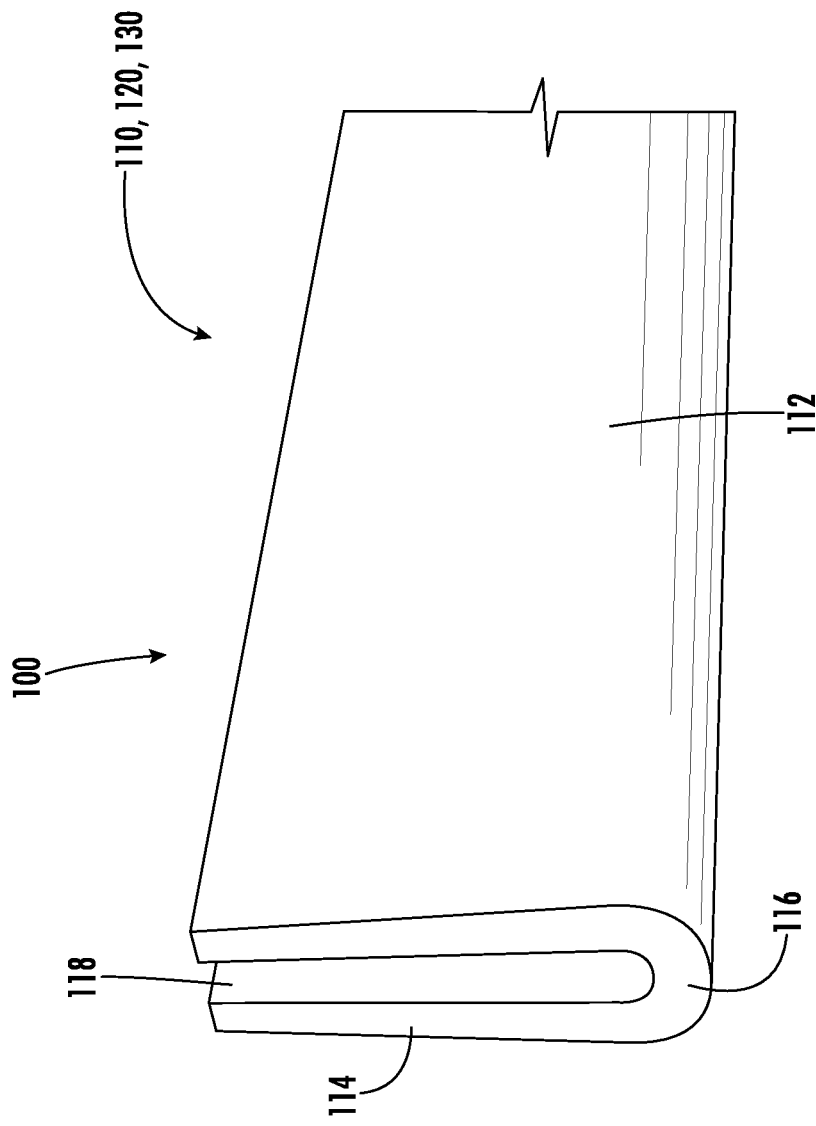

FIG. 8A is a perspective view of a part of the seal, in accordance with some embodiments of the disclosure.

FIG. 8B is an end view the seal, in accordance with some embodiments of the disclosure.

FIG. 8C is an end view of the seal with resistance barbs within the seal, in accordance with some embodiments of the disclosure.

Figure 9A:
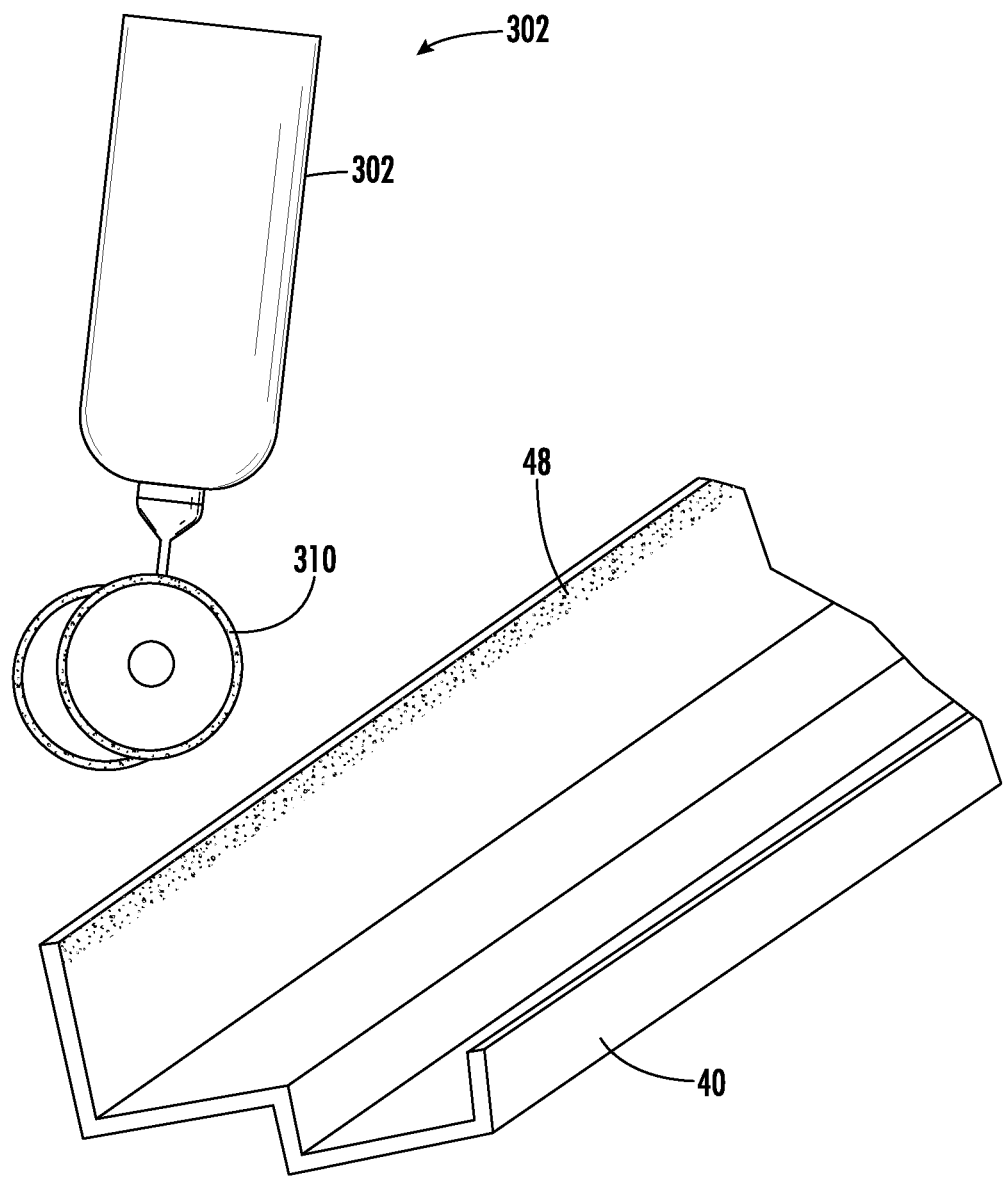

FIG. 9A illustrates a perspective view of an applicator applying a compound to a flange of a segment of the adjustable door frame, in accordance with some embodiments of the disclosure.

Figure 9B:
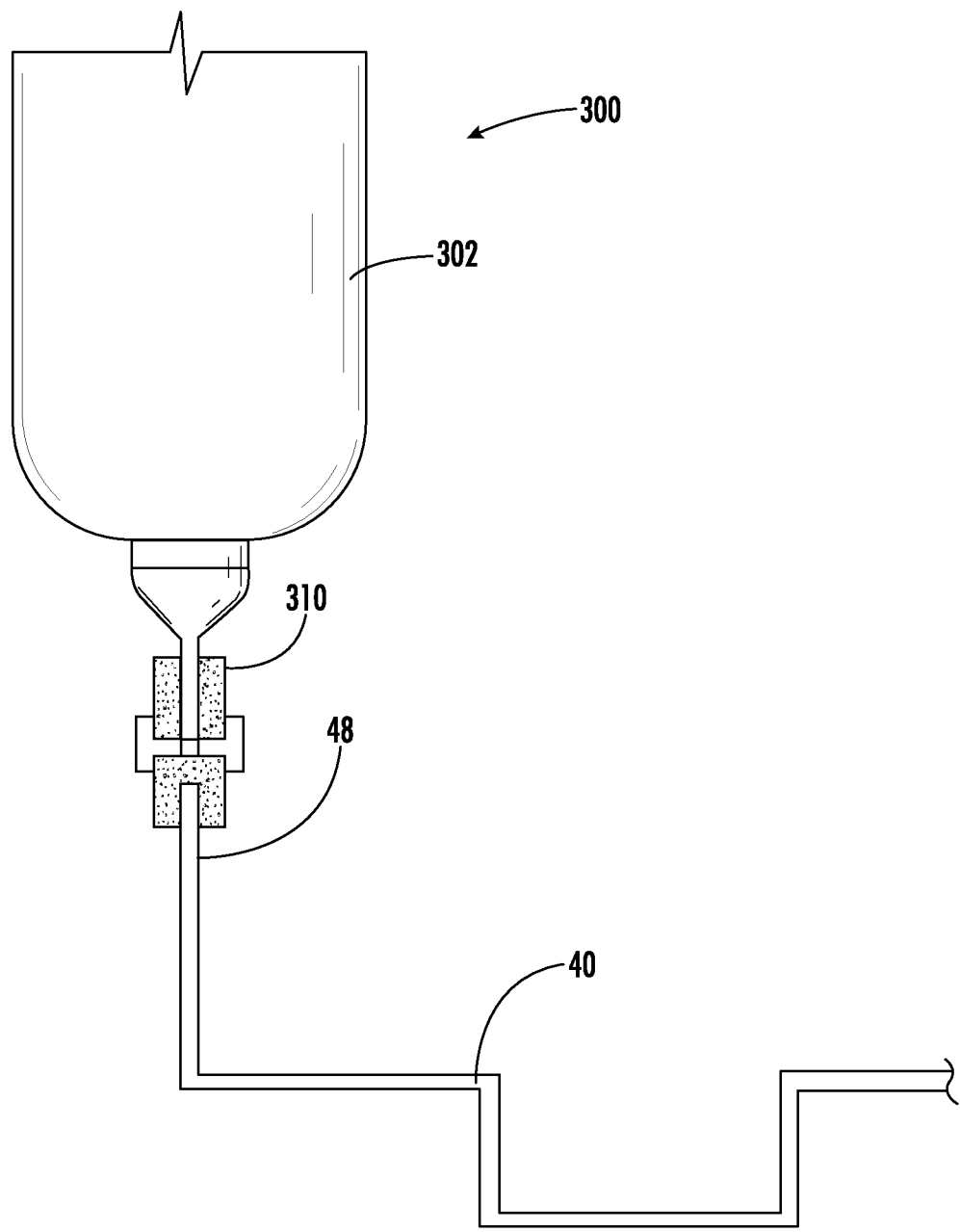

FIG. 9B illustrates a cross sectional side view of an applicator applying a compound to a flange of a segment of the adjustable door frame, in accordance with some embodiments of the disclosure.

Figure 10A:
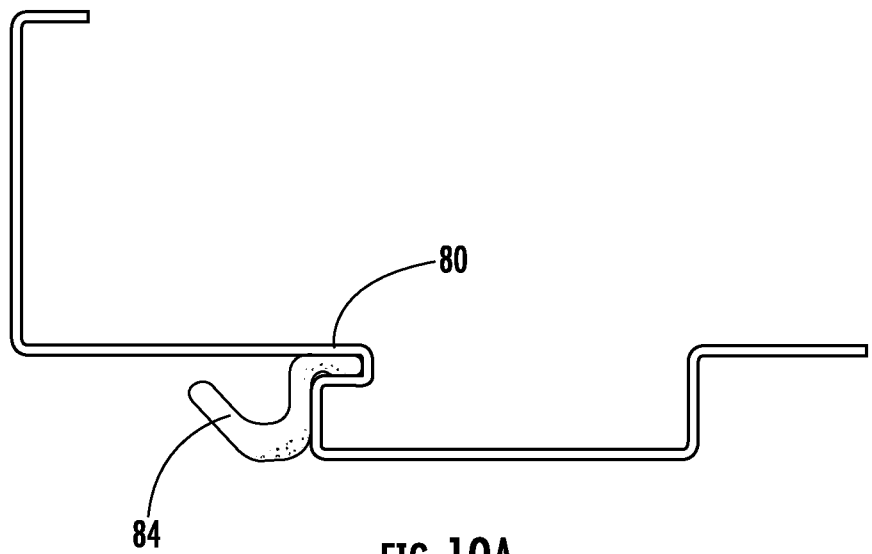

FIG. 10A illustrates a cross-sectional view of a door frame including a seal portion, in accordance with some embodiments of the disclosure.

Figure 10B:
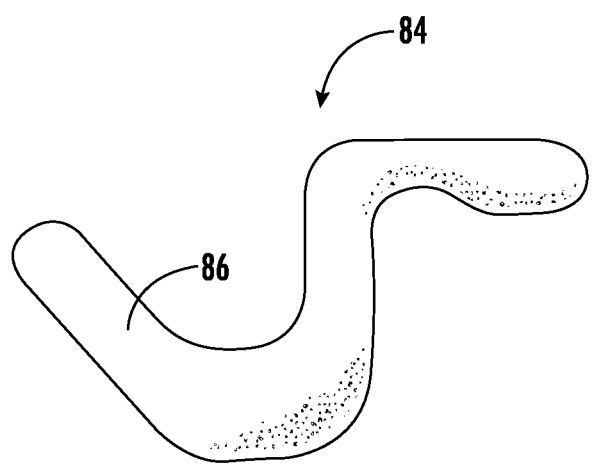

FIG. 10B illustrates a cross-sectional enlarged view of a stop seal for the seal portion of the door frame, in accordance with some embodiments of the disclosure.

Figure 11:
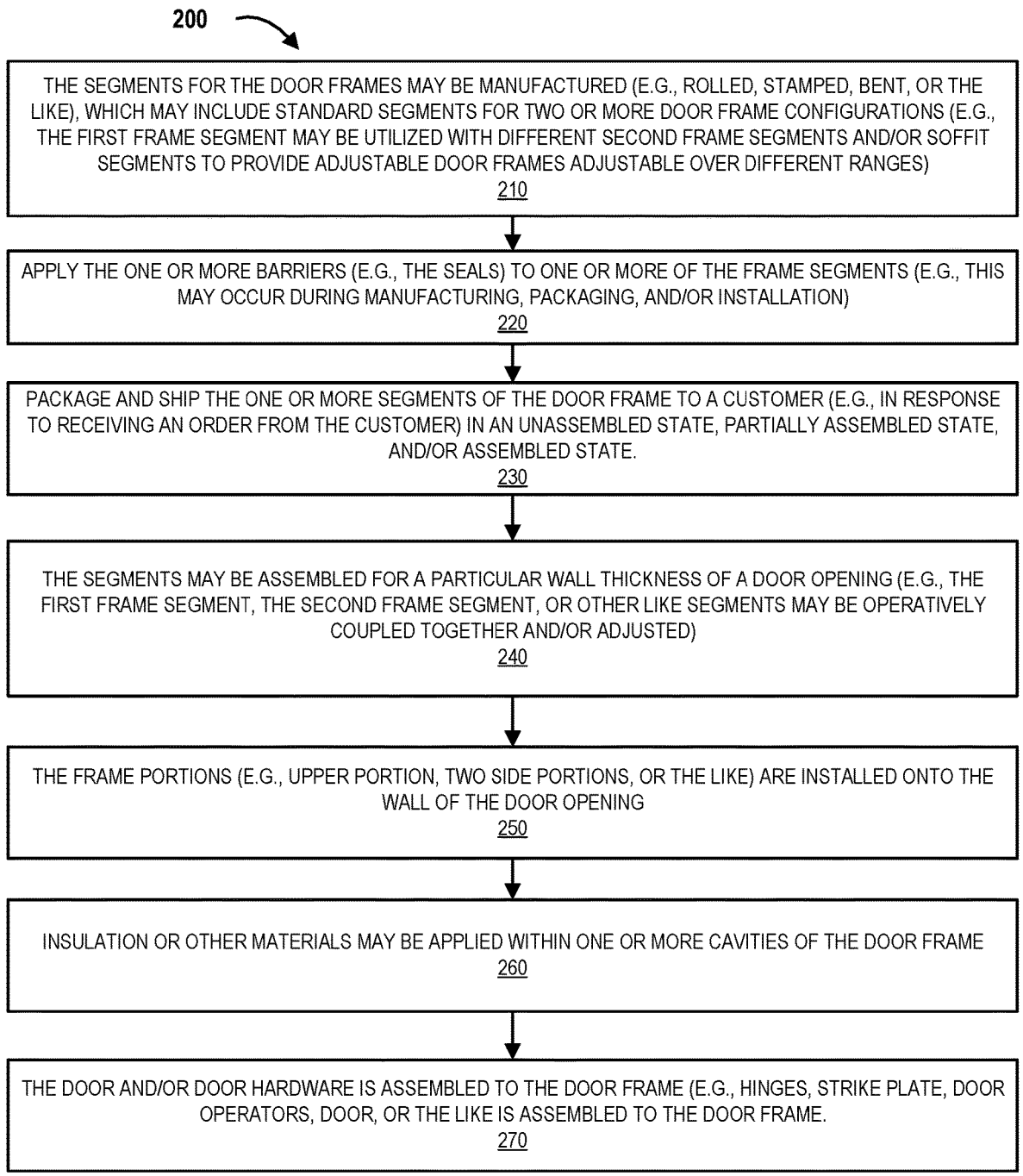

FIG. 11 illustrates a process for manufacturing and installing the adjustable thermal break frame, in accordance with some embodiments of the disclosure.

FIG. 12A illustrates an enlarged view of a door frame and door having shielding, in accordance with some embodiments of the disclosure.

Figure 12B:
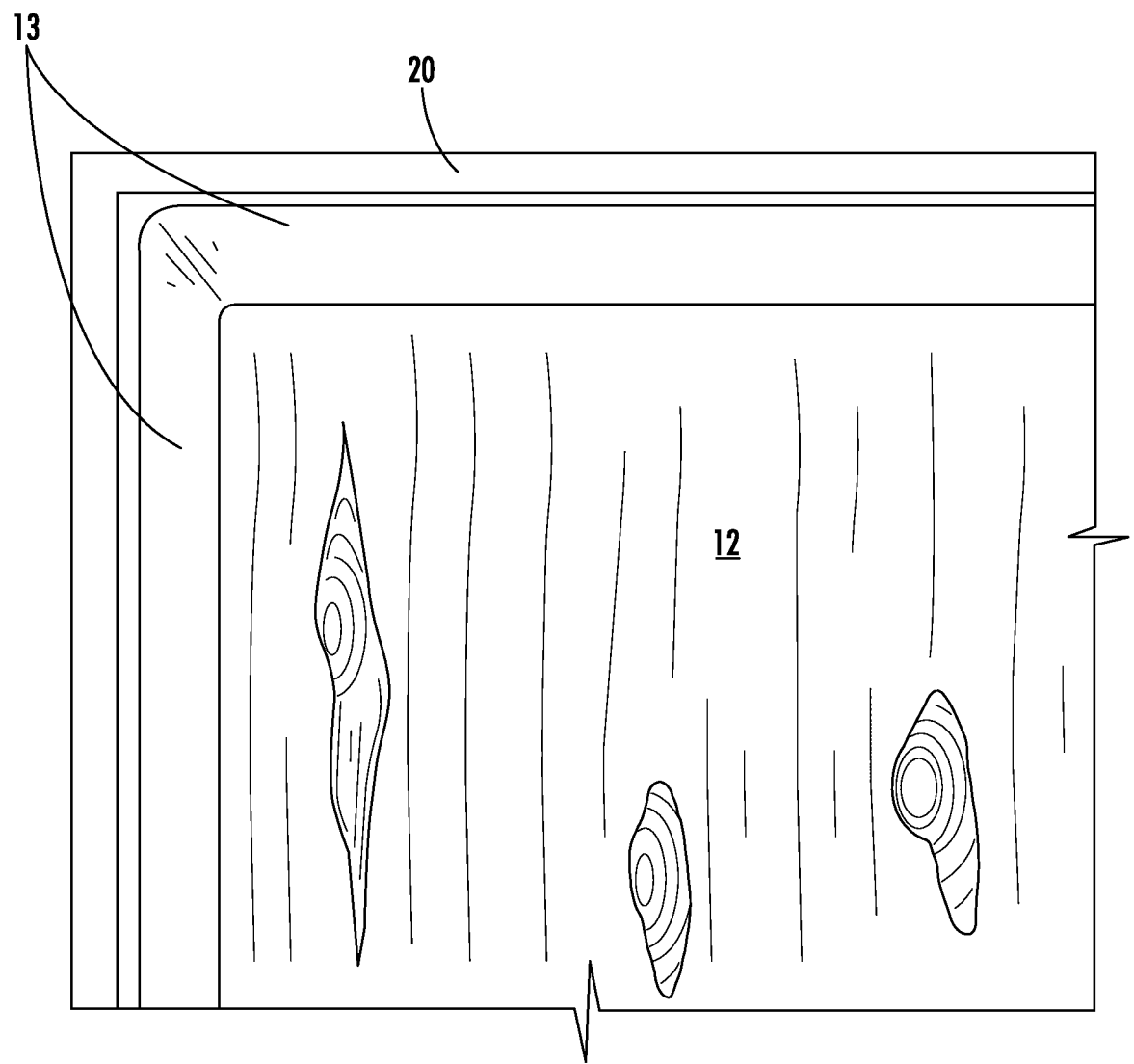

FIG. 12B illustrates another enlarged view of a door frame and door having security features, in accordance with some embodiments of the disclosure.

Figure 12C:
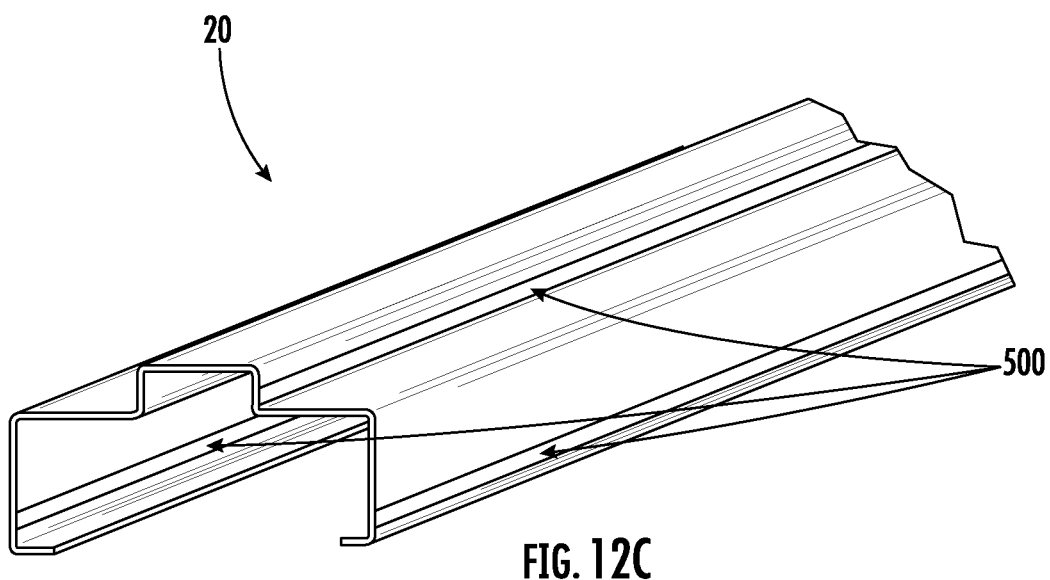

FIG. 12C illustrates a portion of a frame with layers of material, in accordance with some embodiments of the disclosure.

Figure 12D:
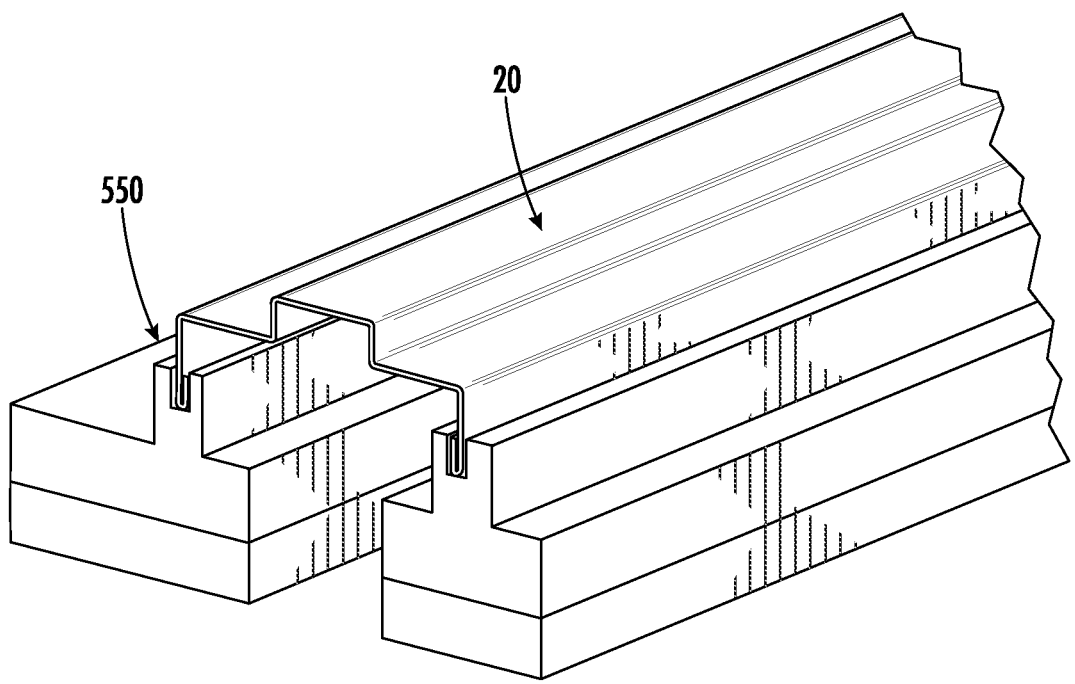

FIG. 12D illustrates an apparatus for applying layers of material to a frame, in accordance with some embodiments of the disclosure.

Figure 13A:
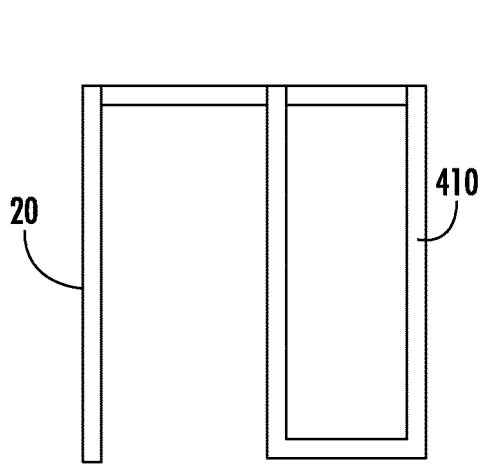

FIG. 13A illustrates a front view of a door frame and sidelight frame, in accordance with some embodiments of the disclosure.

Figure 13B:
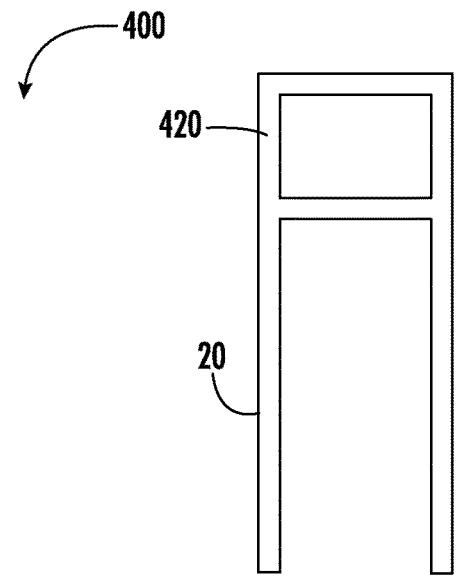

FIG. 13B illustrate a door frame and transom frame, in accordance with some embodiments of the disclosure.

Figure 13C:
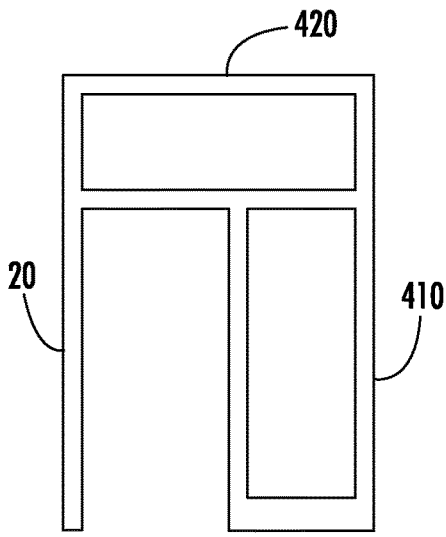

FIG. 13C illustrates a door frame, a sidelight frame, and a transom frame, in accordance with some embodiments of the disclosure.

Figure 13D:
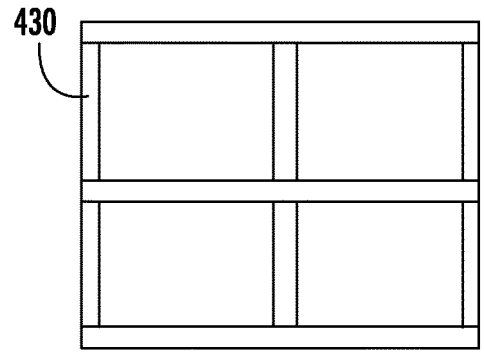

FIG. 13D illustrates a window frame, in accordance with some embodiments of the disclosure.

Figure 13E:
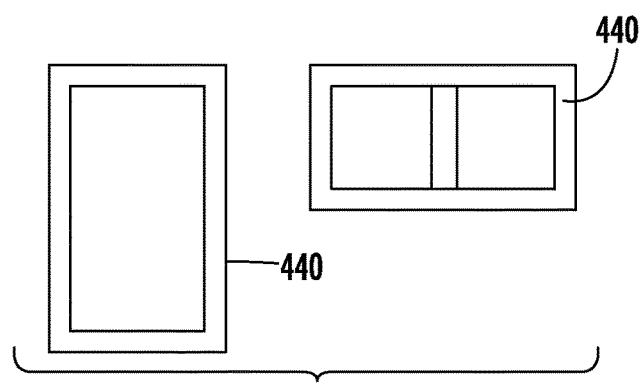

FIG. 13E illustrates borrowed light frames, in accordance with some embodiments of the disclosure.

DETAILED DESCRIPTION

The following detailed description teaches specific example embodiments of the invention; however, other embodiments of the invention do not depart from the scope of the present invention. The terminology used herein is for the purpose of describing particular embodiments only and is not intended to be limiting of the invention. Like reference numbers reference to like elements.

Embodiments of the invention will be described with respect to FIGS. 1A through 8C illustrating a door frame 20 (e.g., otherwise described as an adjustable door frame, an adjustable thermal brake frame, or the like) and/or components thereof. As illustrated in FIGS. 1A and 1B, the door frame 20 may comprise three (3) portions including an upper portion 24 disposed adjacent an upper end of a door opening, and two side portions 26, 28 disposed along either edge of the door opening, with one side portion 26 being on the hinge side of the door, and the opposite side portion 28 being on the latch side of the door. Each portion 24, 26, 28 may be made up of two or more elongated frame segments (e.g., a pair of elongated frame segments 30, 40) of sufficient length to fit the door opening and door. The frame segments 30, 40 are assembled around the open edges of wall 10. A first frame segment 30 may be disposed on the outer side of the door opening (e.g., the side of wall that is normally outside of the door), and a second frame segment 40 may be disposed on the inner side of the door opening (e.g., the side of the wall that is normally enclosed by the door). However, in some embodiments the first frame segment 30 may be disposed on the inner side of the door opening and the second frame segment 40 may be disposed on the outer side of the door opening. In other embodiments, additional door frame segments may be utilized. The door frame portions 24, 26, 28 may be secured to each other and/or an adjoining structure by frame connectors 25 (e.g., clips, tabs, fasteners, or the like). As further illustrated in FIG. 1A, a door 12 may be hung otherwise conventionally within the door opening by hinges 90 secured by fasteners 92 through openings to hinge reinforcements 27 in one (for a single door) or both (for double doors) of frame side portions 26, 28 so that the door face contacts stop flanges 33, 54, 56, or the like as will be described herein. The door 12 may be any type of conventional door, any customized door, or the like.

As illustrated in FIG. 2, and as will be described in further detail herein, the first frame segment 30 may have one or more first adjustment members 50 and/or the second frame segment 40 may have one or more second adjustment members 60. The first adjustment members 50 and/or the second adjustment members 60 may allow the adjustment between the first frame segment 30 and the second frame segment 40 in order to extend around the thickness of the door opening. In some embodiments the first frame segment 30 and the second frame segment 40 are both utilized (e.g., welded to the first frame segment and the second frame segment, respectively) and are operatively coupled to each other (e.g., slidably operatively coupled) to adjust the width of the door frame 20. The segments 30, 40 may be operatively coupled together through the use of one or more segment connectors 70 (e.g., clips, tabs, fasteners, and/or the like) and/or through the use of the one or more first adjustment members 50 and/or the second adjustment members 60.

Moreover, the first frame segment 30 and/or the second frame segment 40 may have one or more barriers 100 in the form of a coating, or as illustrated elongated seals 110 having a first leg 112, a second leg 114, and a connecting member 116 (e.g., u-shaped, v-shaped, or the like). The elongated seals 110 may be located between flanges and surfaces of the first frame segment 30 and the second frame segment 40, as will be discussed herein. The seals 110 may be installed before or after the first frame segment 30 and the second frame segment 40 are adjusted for the thickness of the door opening. As will also be described herein, the one or more barriers 100 may include a strip or coating 102 that may be applied to the segments 30, 40, including at least between the first and/or second adjustment members 50, 60.

The first frame segment 30, the second frame segment 40, the adjustability of the segments 30, 40, and the one or more seals 110 and strips or coatings 102 will be described in further detail with respect to FIGS. 2 through 8C. It should be understood that the segments 30, 40 may have any type of configuration (e.g., number, angles, lengths, thicknesses, or the like) for the flanges (e.g., mounting, stop, jamb, leg, face, and/or other like flanges). However, in some embodiments specific flange configurations will be used, as described in further detail with respect to FIGS. 2 and 3. As illustrated, the first frame segment 30 may comprise a first molding flange 31 that may form a door opening molding (e.g., outer or inner door opening molding), which may be parallel to a wall (e.g., inner or outer wall) and spaced therefrom at one end by the first leg flange 35 (e.g., perpendicular to the first molding flange 31, or the like). Moreover, a first wall flange 36 may extend from the first leg flange 35 (e.g., perpendicular to the first leg flange 35, parallel to a wall 10, or the like). Moreover, a first jamb flange 32 extends adjacent to the other end of the first molding flange 31 (e.g., perpendicular to the first molding flange 31, or the like). A first stop flange 33 may extend adjacent to the other end of the first jamb flange 32 (e.g., perpendicular to the first jamb flange 32, or the like).

The second frame segment 40 has a second molding flange 41, which may be parallel to a wall (e.g., inner or outer wall) and spaced therefrom at one end by a second leg flange 45 (e.g., perpendicular to the second molding flange 41, or the like). Moreover, a second wall flange 46 may extend from the second leg flange 45 (e.g., perpendicular to the second leg flange 45, parallel to a wall 10, or the like). A second jamb flange 42 may extend adjacent to the other end of the second molding flange 41 (e.g., perpendicular to the second molding flange 41, or the like). A second stop flange 43 may extend adjacent to the other end of the second jamb flange 42 (e.g., perpendicular to the second jamb flange 42, or the like). A soffit face 47 may extend adjacent to the other end of the second stop flange 43 (e.g., perpendicular to the second stop flange 43, or the like). A soffit stop flange 48 may extend adjacent to the other end of the soffit face 47 (e.g., perpendicular to the soffit face 47, or the like).

One or more adjustment members 50, 60 (e.g., an adjustment tab, or the like) may be operatively coupled to the first frame segment 30 and/or the second frame segment 40. For example, one or more first adjustment members 50 may be operatively coupled to the first frame segment 30. In some embodiments, the one or more first adjustment members 50 may extend from the first frame segment 30, such as from the first jamb flange 32 (e.g., welded, fastened, or the like to the inner surface of the first jamb flange 32). In some embodiments, one or more second adjustment members 60 may be operatively coupled to the second frame segment 40. The one or more second adjustment members 60 may extend from the second frame segment 40, such as from the second jamb flange 42 (e.g., welded, fastened, or the like to the inner surface of the first jamb flange 32).

The one or more adjustment members 50, 60 may each comprise an adjustment section 52, 62 and an attachment section 54, 64. In some embodiments the adjustment section 52, 62 and the attachment section 54, 64 may be formed in an L-shape, as illustrated in FIG. 2. However, it should be understood that the one or more adjustment members 50, 60 may have any type of shape, including but not limited to a c-shape (as illustrated in FIGS. 6A-6C), u-shaped, v-shape, w-shape, z-shape, other uniform or non-uniform shape, or the like. In some embodiments, the one or more adjustment members 50, 60 may nest within each other and slide with respect to each other to allow for adjustment of the first frame segment 30 and the second frame segment 40. In some embodiments, the one or more adjustment members 50, 60 may comprise one or more first apertures 56 and/or one or more second apertures 66 (e.g., one or more apertures 56, 66 in the adjustment sections 52, 62). The attachment sections 54, 64 may be welded to the first frame segment 30 and the second frame segment 40, respectfully. One or more segment connectors 70 and/or the one or more apertures 56, 66 may be utilized to operatively couple the one or more first adjustment members 50 to the second frame segment 40, the one or more second adjustment members 60 to the first frame segment 30, and/or the one or more first adjustment members 50 to the one or more second adjustment members 60. For example, the one or more segment connectors 70 may be used to set the width (W) of the door frame 20 by operatively coupling the one or more first adjustment members 50 to the one or more second adjustment members 60 through the one or more first apertures 56 and/or the one or more second apertures 66.

FIGS. 4A through 4C illustrate how the door frame 20 may be adjusted based on the thickness of a wall 10. As illustrated in FIG. 4A, the door frame 20 is set at the minimum width (W). Alternatively, in FIG. 4B the door frame 20 is set at one of the intermediate widths (W). Finally, in FIG. 4C the door frame 20 is set at a maximum width. As generally discussed above, the first adjustment member 50 may be slid with respect to the second adjustment member 60. The one or more segment connectors 70 and/or one or more adjustment apertures 56, 66 may be utilized to operatively couple the first adjustment member 50 to the second adjustment member 60 at the desired width for the thickness of the wall of the door opening.

FIGS. 5A though 8C illustrates embodiments of the barriers 100 (e.g., thermal, air inflation/exfiltration, hybrid protection, and/or the like), such as the one or more strips or coatings 102 and/or the one or more seals 110. As illustrated in FIGS. 8A through 8C, the seals 110 that provide the thermal breaks may comprise a first leg 112, a second leg 114, and a connecting member 116 operatively coupling the first leg 112 and the second leg 114. As such, the seal 110 may have an internal seal cavity 118 that is formed by the first leg 112, the second leg 114, and/or the connection member 116. Consequently, it should be understood that the legs 112, 114 and connecting member 116 may form a seal 110 that could be described as a u-shaped seal or v-shaped seal. In some embodiments, as illustrated in FIG. 8A, the seals may have a generally uniform slot as the internal seal cavity 118; however, it should be understood that the first leg 112 and the second leg 114 may coverage or diverge from each other. As illustrated in FIG. 8B, the seals 110 may have a generally oval shape as the internal seal cavity 118. However, it should be understood that the first leg 112 and second leg 114 may form an internal seal cavity 118 that has any uniform or non-uniform shape. As illustrated in FIG. 8C, the seals 110 may have one or more removal resistance members 119, such as one or more barbs, edges, ends, or the like that may be turned inwardly into the internal seal cavity 118 and/or extend from an internal surface of the seal to aid in restricting the removal of the seal 110. It should be understood that in some embodiments, the protective barrier may be a liquid or alternate material that is applied to the frame surfaces, legs and members to cover the frame substrate without use of seals 110 or in addition to the seals 110. As illustrated in FIGS. 5A through 6, it should be understood that one or more coatings, strips, seals 110, or the like may be utilized within the adjustable door frame 20. For example, a first segment seal 120 may be operatively coupled to a first segment flange. As illustrated in FIG. 5A, in some embodiments the first segment seal 120 may be wrapped around the first stop flange 33, such that the first stop flange extends into the internal seal cavity 118 created by the legs 112, 114 and the connecting member 116. As such, a portion of the first segment seal 120 (e.g., the connecting member 116) may slide with respect to the inner surface of the second segment 30 (e.g., an inner surface of a soffit face 47) to allow for adjustment of the door frame 20 (e.g., changing the width of the door frame 20). As further illustrated in FIGS. 5A through 6, a second segment seal 130 may be operatively coupled to a second segment flange. As illustrated in FIG. 5A, in some embodiments the second segment seal 130 may be wrapped around the soffit stop flange 48, such that the soffit stop flange 48 extends into the internal seal cavity 118 created by the legs 112, 114 and the connecting member 116. As such, a portion of the second segment seal 130 (e.g., the connecting member 116) may slide with respect to the outer surface of the first segment 30 (e.g., an outer surface of the first jamb flange 32) to allow for adjustment of the door frame 20 (e.g., changing the width of the door frame 20).

As illustrated in FIGS. 7A and 7B, the thermal barriers 110, such as strips 102 of material, may also be located between the one or more first adjustment members 50 and the one or more second adjustment members 60. FIG. 7A illustrates the one or more first adjustment members 50 and the one or more second adjustment members 60 without the use of thermal barriers 110, such as strips 102 located in-between the adjustment members 50, 60. Alternatively, FIG. 7B illustrates strips 102 that have been operatively coupled to a first adjustment member 50 and a second adjustment member 60, such that the adjustment members are allowed to slide with respect to each other, with the strips 102 located therein that are used to create a thermal break between the one or more first adjustment members 50 and the one or more second adjustment members 60.

In still other embodiments of the invention, a barrier 100 (e.g., thermal, air infiltration/exfiltration, or the like), such as a coating, strip 102, seal 110, or the like may further be located on a stop flange (e.g., a second stop flange 43, and/or the like) (not illustrated), to create a thermal break between the frame 20 and the door 12, when the door is closed.

It should be understood that the thermal barriers 100, such as coatings, strips 102 and/or seals 110 may be made of any type of material (e.g., non-metal material) that provides a thermal break between the first segment 30 and the second segment 40 of the door frame 20. However, it should be understood that in some embodiments the thermal barriers 100 may be a plastic, rubber, silicone, hybrid specialty composites, or the like type of seal 110.

It should be understood that any type of thermal barrier 100 may be utilized, such as but not limited to coatings, adhesives, glues, resins, epoxies, tapes, seals, or the like, or combinations thereof. For example, the strips 102, may include a double sided adhesive tape that is used along with or in-place of one or more of the seals 110. As such, the strips 102 may be a compression-type closed cell polyurethane foam or other strip, which has applied on one surface, or both surfaces, a pressure-sensitive adhesive. An example is Norton V2845 double-sided tape. In other embodiments, the strips 102 may be coatings. Furthermore, while the barriers 100 are generally described herein as thermal barriers that provide a thermal break, it should be understood that additionally, or alternatively, the barriers 100 may be conductive, non-conductive, sound transmission class (STC) rated, EMC shielding, fire resistive, or the like, as will be described in further detail herein.

The one or more seals 110 provide a thermal break between the frame segments 30, 40 (e.g., the first frame segment 30, the second frame segment 40, or the like) that allows the frame segments 30, 40 and/or the flanges and/or surfaces thereof to slide with respect to each other. The thermal break minimizes thermal conduction between the frame segments (e.g., in particular, inner and outer frame segments 30, 40 that are subject to exposure to different temperatures). The one or more thermal barriers 100 between the door frame segments 30, 40 reduces thermal conductivity between the door frame segments 30, 40. The door frame 20 of the present invention is most advantageously used on an exterior wall of a building, where there are extremes in temperature between the building exterior and interior. The thermal barriers 100 (e.g., the seals 102) may also provide a barrier to aid in reducing (e.g., restricting, preventing, or the like) air infiltration and exfiltration through the frame and door opening, thus reducing energy loss through the door system. Alternatively, it may also be used on interior walls where the door 12 encloses a room from a hallway, between different rooms, or like. Moreover, the adjustably of the door frame 20 is advantageously used where wall tolerances are off, where a building has different sized walls (e.g., a uniform frame may be ordered that can be used on any wall thickness within a particular range), to account inaccurate wall measurements, or the like FIGS. 9A and 9B illustrate embodiments for applying a liquid applied barrier, solid seal 110, or the like to the segments (e.g., the first frame segment 30, the second frame segment 40, or the like). For example, a compound (e.g., liquid protective barrier, coating, adhesive, glue, resin, epoxy, tape, or the like) may be utilized as the barrier (e.g., thermal, air, or other protective barrier) or to aid in restricting the movement of the one or more seals 110 with respect to the flanges of the segments 30, 40. For example, an applicator 300 may be used to apply the compound (e.g., adhesive, or the like) to the door frame segments 30, 40 where the one or more seals 100 may be located. The applicator 300 may have a segment applicator head 310 (e.g., a v-shaped, u-shaped, or the like head that applies the compound to the segment, such as flanges of the segments (e.g., on the first stop flange 33, on the soffit stop flange 48, or the like). Additionally, the applicator 300 may have a compound supply 302 that stores the compound (e.g., adhesive reservoir, tape supply, or the like) in communication with the applicator head 310. The applicator head 310 may be static, or may be dynamic (e.g., rotating) in order to aid in applying the compound to the segments 30, 40 (e.g., to the flanges). As illustrated in FIGS. 9A and 9B, the applicator head 310 may be a v-shaped rotatable head that that applies a liquid compound (e.g., adhesive, coating, or the like) to the flanges of the segment. In the situation in which a solid seal is used, the seal 110 may then be placed around the flange, and the compound dries in order to secure the seal 110 to the flange. In alternate embodiments, the applicator 300 may be a seal applicator head that is used to apply a compound to the interior of the one or more seals 110, and then the seals having the compound can be applied to the segments (e.g., flanges of the segments). In some embodiments, the applicator 300 may be used manually to apply the compound; however, in some embodiments the applicator 300 may be automated such that the compound is applied automatically.

It should be understood that embodiments of the present invention may be utilized for any type of door 12 and/or door system 1. In some embodiments, the door 12 and/or door frame 20 may be insulated to aid in reducing heat transfer, sound, or to provide other like security features. As such, in some embodiments a cavity formed between the door frame 20 and the wall 10 may be filled with protective, fire resistive, EMC shielding, Gamma shielding, and/or insulative material, such as RockWool, concrete, fiberglass, polystyrenes, honeycomb, hybrid layers, compound materials, curable and/or hardenable insulation material, or the like. The insulation material may be expanded foam such as BASF 21B density polyurethane expanding foam, using P50341 resin and Honeywell HFO blowing agent. The foam when cured acts to provide thermal insulation through the thickness of the door frame 20. For example, flowable foam may be injected into the cavity of the frame portions formed by the frame segments 30, 40. The injection may be made through foam slots in the door frame segments 30, 40. The flowable foam may be a foam material that expands upon contact with the atmospheric air or alternately a two-part foam that expands upon mixing the two parts together. The flowable foam then hardens and is bonded to the inside surfaces of the frame segments 30, 40. The foam acts both as an insulation material and bonds to the door segments 30, 40. Thus, the present invention may provide an insulated door frame 20 that improves the structural integrity, thermally efficiency, or the like.

Moreover, in some embodiments the door 12 and/or door frame 20 may protect against blasts (blast resistant), forced entry (FE) and/or bullet resistant (BR) (otherwise described as FEBR doors openings) by using ballistic resistant materials such as steel armor, composite BR fiberglass, Kevlar, BR composites, woven layers (as will be discussed in further detail herein), or other like materials as part of the frame core components, as will be described in further detail herein.

In some embodiments, the first frame segment 30, the second frame segment 40, and/or other segments may include a seal cavity (e.g., a kerf seal cavity, or the like). For example, the kerf seal cavity may be formed from portions of a jamb flange (e.g., a second jamb flange 42, or the like) and/or a stop flange (e.g., a second stop flange 43, and/or the like). As such, the seal cavity may be sized to include a seal, such as a kerf seal (not illustrated). As such, the seal cavity 80 may be sized to include a seal 84, such as a kerf seal 86, as illustrated in FIGS. 10A and 10B. Kerf frame seals, like the other barriers 100 described herein, may be made from different materials and have different designs to protect against thermal, sound (STC), weather, fire, or the like, as described herein with respect to the barriers 100.

FIG. 11 illustrates a process for manufacturing and/or installing the adjustable door frame 20 having a thermal break, as described herein. In some embodiments of the invention, one or more of the door frame segments 30, 40 may be a standard size and configuration. For example, in the illustrated embodiment the second frame segment 40 may be a standard size that can be used for any of the door frames 20. As such, while the first door second segment 40 may be a standard size, and may be adjustable with respect to the first frame segment 30, different first frame segments 30 may be used to allow for different ranges of adjustment for different sizes of door opening thicknesses. For example, each of the door frames 20 may have the same second frame segment 40 (e.g., thus reducing the manufacturing costs associated with creating different sized adjustable door frames), but there may be 2, 3, 4, 5, 6, 7, 8, 9, 10, or the like different first frame segments 40. For example, the second frame segments 40 may allow for different ranges of thicknesses for different wall thicknesses. Therefore, as illustrated by block 210 of FIG. 11, the segments for the door frame 20 may be manufactured (e.g., rolled, stamped, bent, or the like). As previously discussed, one or more of the segments 30, 40 may be standard across all door frames 20, and some segments 30, 40 may be limited to one or more of the door frames 20.

As further illustrated in FIG. 11, the one or more thermal barriers 100 (e.g., thermal seals 110, and/or other thermal barriers) may be applied to at least a portion of the one or more of the segments (e.g., the first frame segment 30, the second frame segment 40, and/or the like). It should be understood that the one or more thermal barriers 100 may be applied during manufacturing, packaging, and/or installing of the segments depending on the type of thermal barrier 100 being used (e.g., tape verses sealant, seal 110, or the like) and/or the location of the thermal barrier 100. As previously discussed herein, the thermal barriers 100 may comprise thermal seals 110 that may be slid over a flange of the first frame segment 30 and/or the second frame segment 40. As such, the seals 110 may be pre-applied to the first frame segment 30 (e.g., on the first stop flange 33, or the like) and/or may be pre-applied to the second frame segment 40 (e.g., on the soffit stop flange 48).

As illustrated in block 230, in response to receiving an order from a customer, one or more door frames 20 may be shipped to a customer. It should be understood that the segments 30, 40, may be packaged and shipped uninstalled, partially assembly, and/or assembled (e.g., with the barriers 100 (e.g., thermal, protective, or the like) and/or one or more of the adjustment connectors 70 pre-installed with the segment 30, 40 and/or the adjustment members 50, 60 thereof such that an installer need only make the adjustments to the segments 30, 40 during installation).

Block 240 further illustrates that on site the installer may assemble the segments 30, 40, and/or a portion of the segments 30, 40, such as operatively coupling the segments 30, 40, together and/or adjusting the segments 30, 40 with respect to each other using the one or more adjustment members 50, 60 for the specific wall thickness of the door opening in which the door frame 20 is being installed. For example, the first frame segment 30 may be moved with respect to the second frame segment 40 in order to set a frame width for the door frame 20. The installer may operatively couple the first frame segment 30 to the second frame segment 40 through the use of one or more adjustment connectors 70. For example, the adjustment connectors 70 may be used to operatively couple the one or more first adjustment members 50, the one or more second adjustment members 60 to each other and/or to the first door segment 30 and/or the second door segment 40.

The first adjustment members 50 and/or the second adjustment members 60 may allow the adjustment between the first frame segment 30 and the second frame segment 40 in order to extend around the thickness of the door opening. In some embodiments, the first frame segment 30 and the second frame segment 40 are both utilized (e.g., welded to the first frame segment and the second frame segment, respectively) and are operatively coupled to each other (e.g., slidably operatively coupled) to adjust the width of the door frame 20. The segments 30, 40 may be operatively coupled together through the use of one or more segment connectors 70 (e.g., clips, tabs, fasteners, and/or the like) and/or through the use of the one or more first adjustment members 50 and/or the second adjustment members 60. Moreover, if the thermal seals 110 have not yet been assembled to the frame segments 30, 40, the installer may slide the thermal seals 110 over the flanges of the frame segments 30, 40, as previously discussed herein.

Block 250 of FIG. 11 illustrates that the frame portion (e.g., the upper portion 24 disposed adjacent an upper end of a door opening, and two side portions 26, 28 disposed along either edge of the door opening) are installed onto the wall of the door opening. The door frame portions 24, 26, 28 may be installed on the upper and side portions of the door opening using frame connectors 25 (e.g., clips, tabs, fasteners, or the like). For example, corner tabs and hanger tabs may be used to secure to the door frame portions 24, 26, 28 to the wall 14 around the door opening and/or to the adjacent door frame portions 24, 26, 28.

Block 260 of FIG. 11 illustrates that insulation or other materials may be applied within one or more cavities of the door frame 20. The insulation may provide additional thermal protection between the inner side and outer side of the door frame. Alternatively, forced entry (FE) and/or ballistic resistant (BR) material may be provided within the door frame 20 before and/or after assembly within the door opening.

FIG. 11 further illustrates in block 270, that the door 12 and/or door hardware are assembled to the door frame 20. For example, hinges, a strike plate, door operators, the door, or the like are assembled to the door frame 20 and/or door 12.

The adjustable door frame 20, with or without the thermal breaks, provides improvements over traditional static door frames (e.g., non-adjustable door frame) because the adjustable door frame 20 can be used to account for walls within a building that may be of different sizes, different wall conditions, varying wall thickness, or the like. For example, walls within a building may have different thicknesses due to human error (e.g., installing supports incorrectly, making incorrect measurements), using drywall having different thicknesses (or otherwise applying wall materials having different thicknesses), the building may be older and has had different renovations in the past using different materials, tolerance stack-ups of different components, or the like. As such, buildings may require different door frames specifically sized to accommodate each specific opening in a wall. Consequently, the adjustable door frames 20 of the present invention may be used to account for the different wall conditions within a building without having to use different door frames for different wall conditions (e.g., typical door frames that are fixed in width and jamb depth with no adjustability features).

In particular embodiments, the door system 1 may be an electromagnetic compatibility (EMC) rated door system (e.g., provides electromagnetic interference (EMI), radio frequency interference (RFI), microwave, or the like shielding). The EMC shielding 190 is used to restrict (e.g., reduce, eliminate, or the like) the passing of radio waves, electromagnetic fields, and electrostatic fields outside of the room. EMC materials for EMC shielding may include copper, silver, nickel, aluminum, stainless steel, other types of steel, or other conductive material that would maintain an EMC shielding 190 circuit. Typical shielding materials used for an EMC coating 192, such as a fluid (e.g., liquid, mist, gas, or the like) having a suitable EMC shielding material, typically copper, silver, nickel, aluminum, or the like, or combinations thereof, in the form of particles suspended in the fluid. The EMC coating 192 is applied to a surface, and thereafter dries, to form the EMC shielding 190. Alternatively, the EMC shielding 190 may be an EMC shielding barrier 194 (e.g., fabric-wrapped foam, wire mesh, stamped metal, elastomer, adhesive, glue, resin, epoxy, tape, caulk, or the like) that may be applied to a surface or between surfaces. For example, the EMC shielding barrier 194 may be a copper layer, copper screen, aluminum layer, or the like in order to absorb the radio and magnetic waves.

EMC shielding 190 may be used in many different applications, such as in healthcare rooms (e.g., MRI rooms, or the like), IT/data storage facility protection, government buildings (e.g., embassies, department of state, secret service, or the like), military applications, businesses, labs, emergency call centers, sensitive electronic installations, security facilities, financial centers, RFID scanning locations, or the like. As such, EMI shielding may be used to help avoid computer crashes, protect sensitive electronic equipment, protect storage of confidential information, avoid interference from RF transmitters (e.g., from radio towers, TV broadcast, airport radar, test equipment, or the like), and/or other like applications.

Frequencies at which electromagnetic radiation of energy occurs is at follows: at very low frequencies: −9 kHz, low: 9 to 300 kHz; medium frequencies: 300 to 3,000 kHz; high frequencies: 3 to 30 MHz, very high frequencies: 30 to 300 MHz, ultrahigh frequencies: 300 to 3,000 MHz, superhigh frequencies: 3 to 30 GHz, and extremely high frequencies: 30 to 300 GHz. Typical EMC shielding shields from approximately 40 dB to 140 dB from 10 kHz to 18 GHz; however, it should be understood that EMC shielding may occur within these ranges, overlap these ranges, or fall outside of these ranges. The relative capability of a shield to screen out undesirable electric and magnetic fields and plane waves is the ratio of the signal received without the shield to the signal received inside the shield.

A room that is designed for EMC shielding typically has shielding in the walls 10, doors 12, ceiling, floor, frame 20, or the like. Moreover, the EMC shielding 190 may be utilized, such as by forming a component from EMC material, covering a component in one or more layers (e.g., sheets, or the like) of an EMC material, coating a component with a fluid (e.g., liquid, mist, gas, or the like) that has EMC material particles suspended therein, or the like. It should be understood, breaks in the shielding reduce the effectiveness of the EMC shielding 190. As such, in order to use provide the EMC shielding 190 in the present embodiments the components of the door system 1 incorporate the EMC shielding 190 in one or more ways.

With respect to door frames, as illustrated in FIG. 12A, the adjustable door frame 20 may have EMC shielding 190, such as made from an EMC shielding material (e.g., aluminum, steel, stainless steel, or the like) and/or have a painted EMC shielding coating 192 (e.g., cooper, silver, nickel, or the like, particles, or combinations thereof in a fluid). For example, the segments previously discussed herein, such as the first frame segment 30, the second frame segment 40, or the like, may be made from EMC material and/or covered with a painted EMC shieling coating 192. It should be understood that EMC shielding material may be included on one side or both sides of the segments. Alternatively, or additionally, in order to maintain the effectiveness of the EMI shielding, a EMC shielding barrier 194 (e.g., fabric-wrapped foam, wire mesh, stamped metal, elastomer, adhesive, glue, resin, epoxy, tape, caulk, or the like) may be applied on the segments or between the segments (e.g., single segment, the first segment 30, the second segment 40, or the like) and/or between the frame 20 and the wall 10, or the like. For example, the EMC shielding barrier 194, such as a caulk, may be used on the edges of the frame 20 (e.g., to the wall 10, between segments 30, 40, or the like) to maintain the EMC circuit between the frame 20 and the wall 10. Consequently, not only may the door frame be an adjustable door frame 20, but it can still be used to provide EMC shielding.

As further illustrated in FIG. 12A, in order to maintain the EMC shielding 350 between the frame 20 and the door 12 in the door system 1, the door 12 may have shielding on the faces (e.g., front face and/or rear face) and/or formed as one or more layers within the door 12, as well as on the edges 13 of the door 10 (e.g., the first side edge, the second side edge, the upper edge and the bottom edge). As illustrated in FIG. 12A, the EMC shielding 190 may be the painted EMC shielding coating 192, however, it could be the EMC shielding barrier 192 described above. Furthermore, one or more seals may be used between the frame 20 and the door 12 that are made of and/or covered in an EMC material in order to improve the EMC shielding circuit between the frame 20 and the door 12.

It should be understood that a floor seal system (not illustrated) may be provided at the bottom edge of the door 12. Similar to the frame portions 24, 26, 28 discussed previously, a seal mount, the bottom seal, and/or a threshold may have EMC shielding 190. As previously discussed, the door 12 may have EMC shielding 190, such as an EMC shielding coating 192 to maintain the EMC circuit between the door 12, bottom seal, and the floor. The threshold may be utilized in order to reduce the gap between a bottom edge of the door 12 and the floor, in order to maintain the EMC circuit between the door 10 and the floor (e.g., EMC shielding 190 on or in the floor). As such, the threshold may be made of or be operatively coupled to an EMC material 190, such as an EMC shielding coating 192 and/or an EMC shielding barrier 194. In some embodiments the threshold may have a threshold seal that is operatively coupled to the threshold (e.g., a channel in the threshold, or the like) which may interact with the bottom edge of the door 12 and/or a bottom seal of the door 12. As such, when the door 12 is closed, the one or more bottom seals may maintain the circuit with the floor and/or the threshold.

It should be understood that the embodiments of the present invention provides improved EMC shielding 190 for the door system 1. However, it should be understood that alternatively, or additionally, the EMC shielding 190 security features of the door system 1 may be replaced by, or may also provide, other security features. For example, the security features may include FEBR protection (e.g., forced entry, ballistic, blast, or the like protection), sound abatement, fire and/or smoke protection, air flow reduction, or the like, and/or combinations of any of the foregoing.

As such, as illustrated in FIG. 12B, in some embodiments, the edges 13 of the door 12 may provide for EMC protection, sound abatement, thermal protection, air restriction, fire rating, or other security features, as described herein. As such, the frame 20 (e.g., on the surface, or the inside of the frame 20) and the door 12 (e.g., faces, or the inside of the door 12) may be covered in one or more layers of material 500 in order to provide the desired security features and/or aesthetic decorative features. For example, the frame 20 and/or the door 12 may have film, paint, coatings, a printed surface (e.g., ink, laser, or the like), fabric, or the like layers of material 500 that provide security features and/or aesthetic decorative features. When the door 12 is in the closed position, the edge 13 may or may not contact or be connected to the interior surface of the frame 20 (e.g., directly or through the use of a barrier, seal, or the like) in order to provide the desired security features. For example, the edge 13 may be free of layers in order to provide the desired security feature and/or may have a specific type of material (e.g., stainless steel, copper, or the like material) in order to provide the desired security features. Moreover, in some embodiments, a sealing member may be used to provide contact between the edge 13 of the door 12 and the interior surface of the frame 20 (e.g., provide the EMC circuit is not broken, provide a thermal break, provide sound abatement, restrict air flow, or the like). As such, the edge 13 of the door and the interior of the frame 20 may or may not contact each other in order to provide the desired security features. In some embodiments, the edges 13 of the door 12, the door, and/or door frame, may be made of steel (e.g., stainless steel), which may provide the desired security features (e.g., EMC shielding).

As illustrated in FIGS. 12C and 12D, it should be understood that the security features, may be applied to the frame 20 (e.g., a single unitary frame, the individual frame segments 30, 40, or the like) and/or the door 12 as one or layers of material 500 (e.g., as a liquid or a solid). For example, as illustrated in block 14C, the one or more layers of material 500 (e.g., EMC shielding, thermal, sound abatement, air restriction, or the like layer) may be applied to one or more surfaces of the frame 20, such as the jamb, faces, stops, flanges, or the like depending on the configuration and the desired security features. Moreover, FIG. 12D illustrates one embodiment for applying a material layer that provides the desired security features. As illustrated in FIG. 12C the frame 20 (e.g., the flanges, or the like thereof) may be inserted into a mold 550 that includes a material in liquid form that then hardens, that includes a solid material layer that is extruded over a portion of the frame 20, that applies a solid layer (e.g., tape, film, or the like) onto the frame 20 (e.g., flanges, or the like), or the like, in order to quickly and repeatably create the material layer 500 on the frame 20 that provides the desired security features. It should be understood that the material layer may be formed with or without a mold, by dipping, rolling, spraying, painting, extrusion, liquid or solid applicator, or using another like apparatus for applying the material layer to the frame 20 and/or the door 12.

While the present disclosure is described herein as relating to utilizing an adjustable frame, it should be understood that the security features, as well as the application thereof, may be utilized on any type of frame (e.g., standard, custom, adjustable, kerf, thermal break, decorative, sound abatement, multi-technology, composite, or the like).

In some embodiments, in the event that the door 12 and/or door frame 20 are FEBR door 12 and/or door frames 20, the door frame 20 may include one or more layers of conventional and/or non-conventional ballistic resistant materials. In one embodiment the non-conventional ballistic resistant materials may include (i) a first layer (e.g., a projectile resistant layer) formed from one or more fiber layers, and (ii) one or more additional layers of a sheet (e.g., a porous sheet) and/or one or more additional layers of a fill material. Typically, the first layer may comprise a single fiber layer or a plurality of fiber layers. Each of the one or more fiber layers may comprise, at least in part, a woven or non-woven fibers (e.g., textile fabrics, plastics, or the like).

With respect to fiber layers that are fabric layers, the fabric layers may be manufactured by weaving, knitting or otherwise interlacing certain fibers. In some embodiments, the fabric layers comprise woven (or knitted or interlaced) mineral fibers, such as basalt fibers, in part or in its entirety. In other words, the fabric layer may be formed from a solid mineral, such as basalt. The fabric layer (e.g., the basalt fabric layer, or the like) may comprise a thickness in the range of about 0.005-0.1 inches. In some embodiments, the basalt fabric layer comprises a thickness of about 0.01, 0.015, 0.02, 0.025, 0.030 inches (+/−0.005) and a density of 0.03, 0.04, 0.05, 0.06, 0.07, 0.08, 0.09, 0.10 oz./sq. ft.

(+/−0.005). However, it should be understood that the thickness of each of the one or more fabric layers may be any thickness, and/or have any density (e.g., range between, overlap, and/or fall outside of any of the forgoing values). While the fabric layers may be made, at least in part, from basalt, in other embodiments, at least a portion of the fabric layers may be made out of other minerals, metals, alloys, plastics, composites, organic materials, polymers, etc. It should be understood that the use of one or more fabric layers may aid is resisting physical impacts, as will be discussed in further detail herein.

With respect to plastic layers (e.g., non-woven UHMWPE, or the like), the plastic fibers may be formed into a sheet using a bonding material (e.g., resin, or other like bonding material). In some embodiments the plastic layers may comprise plastic fibers that are bonded with resin into a sheet. In other words, the plastic layer may be formed from a solid mineral (e.g., plastic fibers and resin), such as UHMWPE. The plastic layer (e.g., the UHMWPE layer, or the like) may comprise thicknesses that are the same as or similar to the thickness described with respect to the fabric layers discussed above. While the plastic layers may be made, at least in part, from UHMWPE, in other embodiments, at least a portion of the plastic layers may be made out of other types of plastics, or metals, alloys, composites, organic materials, polymers, etc. It should be understood that the use of one or more plastic layers may aid is resisting physical impacts, as will be discussed in further detail herein. The plastic layer (e.g., UHMWPE, or the like) may be 10, 12, 15, 17, 20, or the like times stronger than steel and/or approximately twice as strong as other high strength polymers (e.g., Kevlar), but is also be light enough to float (e.g., approximately 20, 30, 40, 50 or the like lighter than Kevlar).

It is noted that the one or more fiber layers may form the first layer (e.g., a projectile resistant layer). In the instances where multiple fiber layers form the first layer, the fiber layers may all be the same or similar in terms of materials, fiber composition, fiber thickness, weave pattern, non-weave pattern, grain orientation, and other characteristics, or the fiber layers may differ with respect to at least one characteristic. For example, the fiber layers may be orientated in the same direction or may be orientated in different directions. That is, for example, successive fiber layers may be rotated any degree with respect to each other (e.g., in particular, when the fiber layers are woven and may have a pattern). As such, should the fiber layers have a particular pattern, the fiber layers may be orientated such that the fiber pattern does not line up between at least two of the fiber layers. It should be further understood that when a plurality of fiber layers are used for the first layer, the plurality of fiber layers may be operatively coupled to each other in one or more various ways. For example, the fiber layers may be mechanically coupled together, such as through the use of fasteners (e.g., rivets, pins, needles, or the like) that may be inserted through the fiber layers (e.g., in some cases through the weaves of fabric layers, or the like). Additionally, or alternatively, the fiber layers may be operatively coupled together through the use of a compound (e.g., adhesive, glue, resin, epoxy, tape, or the like) that is applied to one or more opposing surfaces of the fiber layers. In other embodiments, the fiber layers may be operatively coupled together by sandwiching the fiber layers between other layers that are operatively coupled together, by placing the fiber layers within a shell, and/or by bounding the fiber layers with a string, ribbon, mesh, fabric, or other flexible material that may be wrapped around at least a portion of the fiber layers in order to create the first layer (e.g., the projectile resistant layer). It should be understood that the layers described herein may be added to and/or lined with the frame before, during, and/or after manufacturing, packaging, installation, or the like using the same or similar couplings as described with respect to operatively coupling the layers to each other. As such, the layers, including the fill material, may be pre-assembled to one or more of the segments 30, 40, 50, 60, or assembled to the one or more of the segments 30, 40, 50, 60 before and/or after the door frame 20 is installed in the door opening.

It should be understood that the door 12 and/or the door frame 20 may further comprise additional layers, each of which may comprise one or more fiber layers. For example, the door 12 and/or door frame 20 may have a second layer, third layer, fourth layer, or the like, each of which are formed from one or more fiber layers. In the instances where the door 12 and/or door frame 20 comprise multiple projectile resistant layers of one or more fiber layers, each of the projectile resistant layers may be the same or different with respect to the number of the fiber layers therein, arrangement/ordering of the fiber layers therein, characteristics of the fiber layers therein, and/or the like.

Referring to the additional layers of the door 12 and/or door frame 20, the one or more additional layers may comprise a sheet (e.g., a porous sheet), which may typically comprise a material having a plurality of apertures in the form of voids, cavities, hollow interior chambers, surface hollows, slots, and/or through holes. These plurality of apertures may extend over a portion of a thickness, length, and/or width of the sheet, and/or they may extend over the entirety of the thickness, length, and/or width of the sheet. Additionally, the plurality of apertures may extend only partially into the sheet (e.g., embossed into the sheet), or the plurality of apertures may be through holes. Moreover, in some embodiments, the sheet may be a porous sheet, such as, a foam sheet. The foam sheet may be made from a metal, such as aluminum or its alloys. The aluminum foam sheet is porous with a plurality of apertures that create a sponge-like structure and is ultra-light weight, resulting in aluminum foam sheet being able to float in water. The aluminum foam sheet is non-flammable and does not emit any toxic gases. Moreover, the porosity of the aluminum foam sheet (e.g., the air-filled voids in particular), provide acoustic absorption and electromagnetic shielding. The aluminum foam sheet may be manufactured from recycled materials.

The foam sheet may comprise a thickness in the range of about 0.05 to 1.875 inches (or in some embodiments up to 3 inches or more for thicker doors and/or door frames 20). In some embodiments, the foam sheet comprises a thickness of about 0.1, 0.15, 0.20, 0.25, 0.3, 0.35, 0.40, 0.45 to 0.70, 0.75, 0.80, 0.85, 0.9, 0.95, 1, 1.1, 1.2, 1.3, 1.4, 1.5, 1.6, 1.7, 1.8, 1.875, or more inches and a density of about 0.63 lbs./sq. ft (0.55, 0.57, 0.59, 0.61, 0.65, 0.67, 0.69, 0.71, or the like). However, it should be understood that the foam sheet may have any thickness and/or any density (e.g., having a range that falls between, overlaps, and/or falls outside of any of the forgoing values). While the foam sheet may be made of aluminum, in some embodiments, the foam sheet is made from other metals, steel, alloys, minerals, plastics, composites, organic materials, polymers, etc. In some embodiments, the sheet is a grating framework made from suitable metals (e.g., aluminum), steel, alloys, minerals, plastics, composites, organic materials, polymers, etc.

With respect to the one or more additional layers of a fill material, the fill material may comprise an undifferentiated whole structure, a collection of discrete structures, and/or combinations thereof. In the embodiments where the fill material comprises an undifferentiated whole structure, the fill material may be in the form of a solid or foamed sheet. In this regard, the fill material may be a polystyrene sheet having a thickness in the range of about 0.1, 0.15, 0.20, 0.25, 0.3, 0.35, 0.40, 0.45 to 0.70, 0.75, 0.80, 0.85, 0.9, 0.95, 1, 1.1, 1.2, 1.3, 1.4, 1.5, 1.6, 1.7, 1.8, 1.875, or more. However, it should be understood that the fill material may have any thickness (e.g., ranges between, overlaps, and/or falls outside of any of the forgoing values). In the embodiments where the fill material comprises a collection of discrete structures, the fill material may be in the form of pellets, spheroids, grains, or the like. It should be understood that the fill material may be a solid material, or it may be a liquid material that later becomes solid. In some embodiments, the fill material may provide insulation for the door 12 and/or door frame 20.

In some embodiments, the fill material may be a homogenous cementitious material (e.g., concrete, or the like), a composite cementitious material (e.g., including a mixture of cementitious material and/or other materials, such as fibers, foam, or the like). It should be understood that cementitious means any type of cement or other like material, such as traditional cement, fly ash, blast-furnace slag, limestone fines, aggregate, and/or other types of cementitious materials, alone or in combination with each other. The fill material, such as the composite cementitious material, may be much lighter than traditional homogenous cementitious material. For example, the fill material 140 may be 10, 20, 30, 40, 50, 60, 70, or the like percent lighter than traditional cementitious material, or range between, overlap, and/or fall outside of any of these values. It should be understood that the cementitious material may be inserted into (e.g., poured, or the like) into the cavity in the form of a liquid fill material (e.g., completely liquid, liquid having particulates, and/or the like) which then hardens into a solid core.

The arrangement of the layers in the door 12 and/or door frame 20 will now be described in accordance with some embodiments of the invention. In some embodiments, one or more additional layers of a sheet and/or one or more additional layers of a fill material may be positioned in between a first layer, a second layer, and a third layer, each of which has one or more fiber layers. In other embodiments, a pair of layers (e.g., a first layer and a second layer) may be positioned adjacent each other. In yet other embodiments, a sheet (e.g., porous sheet) and a layer of a fill material may be placed next to each other. That said, the one or more layers, each comprising one or more fiber layers, and the one or more additional layers comprising one or more sheets and/or one or more filler layers may be arranged in any suitable order and in any suitable combination, based on the desired application. In some embodiments, the one or more additional layers of a sheet may be operatively coupled to the one or more fiber layers. In some embodiments, the one or more one or more filler layers may be operatively coupled to the one or more fiber layers. It should be understood that the one or more fiber layers, the one or more porous sheets, and/or the one or more filler layers may be operatively coupled to each other as was previously described with respect to operatively coupling the multiple fiber layers together (e.g., fasteners, adhesive, bounding, or the like).

The door 12 and/or door frames 20 of the present disclosure may provide outstanding resistance to and protection from a variety of physical impacts by projectiles. In particular, even though the fiber layers of the door 12 and/or door frame 20 are extremely thin (e.g., about 0.02 inches thick), the fiber layers (e.g., 30 fiber layers, 16 fiber layers, 14 fiber layers, 8 fiber layers, 6 fiber layers, 4 fiber layers, 2 fiber layers, or a single fiber layer, arranged in a stacked formations) are structured to provide various UL level protection from ballistic projectiles (e.g., firearm, or the like) and also protection from other projectiles such as debris or shrapnel. As such, the one or more projectile resistant layers, each comprising the one or more fiber layers (e.g., fabric layer, plastic layers, or the like as discussed herein), may alone or in combination with other layers, provide a door 12 and/or door frame 20 that provides the desired FE (forced entry) and/or BR (Bullet Resistant) properties while providing reduced weights and/or improved shipping and/or installation processes. For example, the door 12 and/or door frame 12 may have UL752 Level 1 (9 mm handgun) to UL 752 Level 10 (.50 Caliber Rifle) protection, and in particular embodiments UL752 level 1 (9 mm), UL752 level 2 (0.357 Magnum), UL752 level 3 (0.44 Magnum), UL752 level 4 (.30 Caliber Rifle), UL752 level 5 (7.63 Caliber Rifle) UL752 level 6 (9 mm Rifle), UL752 level 7 (5.56 mm), UL752 level 8 (7.62 mm), UL752 level 9 (0.30-06 rifle), UL752 level 10 (.50 caliber rifle), or the like protection (e.g., as defined at the time of filing this application), or have protection that ranges between, overlaps, or falls outside of these levels of protection. Furthermore, the door 12 and/or door frame 20 may also be rated to withstand 5, 10, 15, 20, 25, 30, 40, 50, 60, or the like minutes of simulated "mob" attack, or range between, overlap, or outside of these levels of protection. In some embodiments of the invention, the fiber layers may be fabric layers of basalt woven fabric, other similar material. In some embodiments of the invention, the fiber layers may be plastic layers of UHMWPE. In some embodiments of the invention, the one or more projectile resistant layers may comprise other types of materials, such as, but not limited to Kevlar or other Bullet resistant fabrics (e.g., woven fabric, non-woven fabric, knitted fabric, other fabrics, or the like) or bullet resistant plastic that provide the same or similar protection as described with respect to the fiber layers. The protective or filler layers and materials can be added separately, or may be bonded together using structural adhesives, resins, heat, mechanical or other similar means. Furthermore, the costs of the various layers of the composite door systems are about half the cost of conventional materials without adding bulk to the composite door systems 1 (e.g., doors 12 and/or door frame 20 in which they are used).

Moreover, the sheet layers, such as a porous sheet (e.g., the aluminum foam, or the like), used in the door and/or door frame 20 are structured to exhibit electrical resistance (e.g., because it does not conduct electricity), provide electronic shielding from radio frequency and medium frequency waves, provide fire protection (e.g., because it is non-inflammable), and provide various other properties that conventional materials are not able to provide. In other embodiments, the sheet layers may comprise a polycarbonate, SGG material, or other type of foam sheet.

Furthermore, fill material is described generally herein as providing additional material in order to fill out the thickness of the door 12 and/or the door frame 20, and in some embodiments provide an insulated core to at least a portion of the door 12 and/or door frame 20. While the fill material is generally described as being a polystyrene sheet or other type of structure (e.g., loose material, or the like), it should be understood that the fill material may be any type of material (e.g., lightweight, or the like), such as, but not limited to a polyisocyanurate, polyurethane, fiberglass, cellulose, mineral wool, kraft paper (e.g., structural, or the like), plastics, polycarbonates, vermiculite, perlite, cementitious foam (e.g., magnesium oxide, such as magnesium silicate), phenolic foam, or other like material. Regardless of the fill material, it may provide structural, protective, sound transmission prevention, fire resistance or fire proofing, or the like properties. In some embodiments the fill material may also have projectile resistance (e.g., firearm, blast, weather related resistance—wind, projectile, or the like, mob attack) and/or may have other properties that provide chemical resistance, radio frequency resistance, electromagnetic resistance, or the like.

While the present invention is described herein as being used with respect to door frames, it should be understood that the embodiments of the door frame 20 described herein may be applied to any type of frame 400 for any type of barrier component, such as a sidelight, transom, borrowed lights, windows, or the like. FIGS. 13A through 13E illustrated different types of frames 400 which could use one or more embodiments of the invention described herein with respect to door frames 20. For example, FIG. 13A illustrates a door frame 20 and sidelight frame 410; FIG. 13B illustrate a door frame 20 and transom frame 420; FIG. 13C illustrates a door frame 20, a sidelight frame 410, and a transom frame 320; FIG. 13D illustrates a window frame 430; and FIG. 13E illustrates borrowed light frames 340. As such, the embodiments of the present invention discussed herein with respect to a door frame 20 may be utilized in any type of frame 400 in any type of barrier 2 (e.g., wall, or the like).

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and should not be interpreted in an idealized or overly formal sense unless expressly so defined herein. Certain terminology is used herein for convenience only and is not to be taken as a limitation on the invention. For example, words such as "distal," "proximal," "upper," "top," "bottom," "lower," "left," "right," "horizontal," "vertical," "upper," and "lower", or other like terminology merely describe the configuration shown in the figures. The referenced components may be oriented in an orientation other than that shown in the drawings and the terminology, therefore, should be understood as encompassing such variations unless specified otherwise.

As used herein, the singular forms "a", "an" and "the" are intended to include the plural forms as well, unless the context clearly indicates otherwise. It will be further understood that the terms "includes" and/or "including" when used herein, specify the presence of stated features, steps, operations, elements, and/or components, but do not preclude the presence or addition of one or more other features, steps, operations, elements, components, and/or groups thereof.

It will be understood that when an element is referred to as "operatively coupled" to another element, the elements can be formed integrally with each other, or may be formed separately and put together. Furthermore, "operatively coupled" to can mean the element is directly coupled to the other element, or intervening elements may be present between the elements. Furthermore, "operatively coupled" may mean that the elements are detachable from each other, or that they are permanently operatively coupled together.

When components are described as being parallel or perpendicular to other components, it should be understood that this many encompass the components being exactly parallel or perpendicular, or generally parallel or perpendicular in which the components deviate from exactly parallel or perpendicular (e.g., +/−1, 2, 4, 6, 8, 10, 15, 20, 25, or the like degrees from exactly parallel or perpendicular).

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

INCORPORATION BY REFERENCE

To supplement the present disclosure, this application further incorporates entirely by reference the following commonly assigned patent applications:

| U.S. patent application Ser. No. | Title | Filed On |
|---|---|---|
| 17/831,653 | ADJUSTABLE FRAME WITH A THERMAL BREAK | Jun. 3, 2022 |
| 17/831,666 | SECURITY FEATURES FOR A SLIDING DOOR SYSTEM | Jun. 3, 2022 |
| 17/831,676 | ADJUSTABLE DOOR FRAME FOR A SLIDING DOOR | Jun. 3, 2022 |

What is claimed is:

1. A frame for an opening, the frame comprising:
   at least one first frame segment;
   at least one second frame segment;
   a first segment thermal barrier operatively coupled to a first segment flange of the at least one first frame segment and engaging an inner surface of the at least one second frame segment;
   a second segment thermal barrier operatively coupled to a second segment flange of the at least one second frame segment and engaging an outer surface of the at least one first frame segment;
   one or more adjustment members operatively coupled to the at least one first frame segment or the at least one second frame segment; and
   one or more adjustment thermal barriers operatively coupled to the one or more adjustment members;
   wherein the at least one first frame segment is adjustable with respect to the at least one second frame segment with the first segment thermal barrier and the second segment thermal barrier installed; and
   wherein the first segment thermal barrier, the second segment thermal barrier, and the one or more adjustment thermal barriers create a thermal break between the at least one first frame segment and the at least one second frame segment.

2. The frame of claim 1, wherein the first segment thermal barrier and the second segment thermal barrier comprise a seal comprising:
   a first leg;
   a second leg; and
   a connecting member operatively coupling the first leg and the second leg.

3. The frame of claim 2, wherein the seal comprises a u-shaped or a v-shaped seal.

4. The frame of claim 1, wherein the one or more adjustment members comprise:
one or more first adjustment members operatively coupled to the at least one first frame segment; and
one or more second adjustment members operatively coupled to the at least one second frame segment;
wherein the at least one first frame segment is adjustable with respect to the at least one second frame segment through the one or more first adjustment members and the one or more second adjustment members.

5. The frame of claim 4, wherein the one or more first adjustment members and the one or more second adjustment members are slidably operatively coupled to each other.

6. The frame of claim 1, wherein the one or more adjustment members comprise:
a first section;
a second section; and
one or more apertures in the first section or the second section.

7. The frame of claim 6, wherein the one or more adjustment members comprise an L-shaped adjustment member having the first section and the second section.

8. The frame of claim 1, further comprising:
one or more adjustment connectors, wherein the one or more adjustment connectors operatively couple the one or more adjustment members to the at least one first frame segment, the at least one second frame segment, or to each other when there are two or more adjustment members.

9. The frame of claim 1, wherein the first segment flange is a first stop flange and the inner surface is on a soffit inner face, and wherein the second segment flange is a soffit stop flange and the outer surface is on a first jamb flange.

10. The frame of claim 9, wherein the at least one first frame segment comprises:
a first molding flange; and
the first jamb flange adjacent to the first molding flange;
wherein the first stop flange is adjacent to the first jamb flange.

11. The frame of claim 10, wherein the at least one second frame segment comprises:
a second molding flange;
a second jamb flange adjacent to the second molding flange;
a second stop flange adjacent to the second jamb flange; and
a soffit face adjacent to the second stop flange;
wherein the soffit stop flange is adjacent the soffit face.

12. A frame for an opening, the frame comprising:
at least one first frame segment for an upper portion or side portions of the opening, the at least one first frame segment having a first molding flange, a first jamb flange adjacent to the first molding flange, and a first stop flange adjacent to the first jamb flange;
at least one second frame segment for the upper portion or the side portions of the opening, the at least one second frame segment having a second molding flange, a second jamb flange adjacent to the second molding flange, a second stop flange adjacent to the second jamb flange, a soffit face adjacent to the second stop flange, and a soffit stop flange adjacent the soffit face;
a first segment thermal barrier operatively coupled to the first jamb flange of the at least one first frame segment and engaging an inner surface of the at least one second frame segment;
a second segment thermal barrier operatively coupled to the soffit stop flange of the at least one second frame segment and engaging an outer surface of the at least one first frame segment; and
one or more adjustment members operatively coupled to the first frame segment or the second frame segment;
wherein the at least one first frame segment is adjustable with respect to the at least one second frame segment through the one or more adjustment members; and
wherein the first segment thermal barrier and the second segment thermal barrier create a thermal break between the at least on first frame segment and the at least one second frame segment.

13. The frame of claim 12, wherein the first segment thermal barrier and the second segment thermal barrier comprise a seal comprising:
a first leg;
a second leg; and
a connecting member operatively coupling the first leg and the second leg.

14. The frame of claim 12, further comprising:
one or more adjustment thermal barriers operatively coupled to the one or more adjustment members;
wherein the one or more adjustment thermal barriers aid in forming the thermal break between the one or more adjustment members and the at least one first frame segment or the at least one second frame segment.

15. A method of forming a frame, the method comprising:
adjusting at least one first frame segment with respect to at least one second frame segment through the use of one or more adjustment members operatively coupled to the at least one first frame segment or the at least one second frame segment, wherein the at least one first frame segment comprises a first segment thermal barrier operatively coupled to a first segment flange and engaging an inner surface of the at least one second frame segment, and wherein the at least one second frame segment comprises a second segment thermal barrier operatively coupled to a second segment flange and engaging an outer surface of the at least one first frame segment, and one or more adjustment thermal barriers operatively coupled to the one or more adjustment members, wherein the at least one first frame segment is adjustable with respect to the at least one second frame segment with the first segment thermal barrier and the second segment thermal barrier installed, and wherein the first segment thermal barrier, the second segment thermal barrier, and the one or more adjustment thermal barriers create a thermal break between the at least one first frame segment and the at least one second frame segment; and
securing the at least one first frame segment to the at least one second frame segment through the use of one or more adjustment connectors;
wherein the first segment thermal barrier and the second segment thermal barrier create a thermal break between the at least one first frame segment and the at least one second frame segment.

16. The method of claim 15, further comprising:
applying the first segment thermal barrier to the at least one first frame segment and the second segment thermal barrier to the at least one second frame segment.

17. A frame for an opening, the frame comprising:
at least one first frame segment;
at least one second frame segment;
a first segment thermal barrier operatively coupled to a first segment flange of the at least one first frame segment and engaging an inner surface of the at least one second frame segment;

a second segment thermal barrier operatively coupled to a second segment flange of the at least one second frame segment and engaging an outer surface of the at least one first frame segment;

one or more first adjustment members operatively coupled to the at least one first frame segment; and one or more second adjustment members operatively coupled to the at least one second frame segment;

wherein the at least one first frame segment is slidably adjustable with respect to 13 the at least one second frame segment through the one or more first adjustment members and the one or more second adjustment members with the first segment thermal barrier and the second segment thermal barrier installed; and wherein the first segment thermal barrier and the second segment thermal barrier create a thermal break between the at least one first frame segment and the at least one second frame segment.

18. A frame for an opening, the frame comprising:
at least one first frame segment;
at least one second frame segment;
a first segment thermal barrier operatively coupled to a first segment flange of the at least one first frame segment and engaging an inner surface of the at least one second frame segment;
a second segment thermal barrier operatively coupled to a second segment flange of the at least one second frame segment and engaging an outer surface of the at least one first frame segment; and
one or more adjustment members operatively coupled to the at least one first frame segment or the at least one second frame segment, wherein the one or more adjustment members comprise:
  a first section;
  a second section; and
  one or more apertures in the first section or the second section;
wherein the at least one first frame segment is adjustable with respect to the at least one second frame segment with the first segment thermal barrier and the second segment thermal barrier installed; and
wherein the first segment thermal barrier and the second segment thermal barrier create a thermal break between the at least one first frame segment and the at least one second frame segment.

19. A frame for an opening, the frame comprising:
at least one first frame segment;
at least one second frame segment;
a first segment thermal barrier operatively coupled to a first segment flange of the at least one first frame segment and engaging an inner surface of the at least one second frame segment;
a second segment thermal barrier operatively coupled to a second segment flange of the at least one second frame segment and engaging an outer surface of the at least one first frame segment; and
one or more adjustment members operatively coupled to the at least one first frame segment or the at least one second frame segment;
one or more adjustment connectors, wherein the one or more adjustment connectors operatively couple the one or more adjustment members to the at least one first frame segment, the at least one second frame segment, or to each other when there are two or more adjustment members;
wherein the at least one first frame segment is adjustable with respect to the at least one second frame segment with the first segment thermal barrier and the second segment thermal barrier installed; and
wherein the first segment thermal barrier and the second segment thermal barrier create a thermal break between the at least one first frame segment and the at least one second frame segment.

20. A frame for an opening, the frame comprising:
at least one first frame segment, wherein the at least one first frame segment comprises:
  a first molding flange;
  a first jamb flange adjacent to the first molding flange; and
  a first stop flange adjacent to the first jamb flange;
at least one second frame segment, wherein the least one second frame segment comprises:
  a second molding flange;
  a second jamb flange adjacent to the second molding flange;
  a second stop flange adjacent to the second jamb flange;
  a soffit face adjacent to the second stop flange; and
  a soffit stop flange adjacent the soffit face;
a first segment thermal barrier operatively coupled to the first stop flange of the at least one first frame segment and engaging a soffit inner face of the soffit face of the at least one second frame segment;
a second segment thermal barrier operatively coupled to the soffit stop flange of the at least one second frame segment and engaging an outer surface of the first jamb flange of the at least one first frame segment; and
wherein the at least one first frame segment is adjustable with respect to the at least one second frame segment with the first segment thermal barrier and the second segment thermal barrier installed; and
wherein the first segment thermal barrier and the second segment thermal barrier create a thermal break between the at least one first frame segment and the at least one second frame segment.

* * * * *

UNITED STATES PATENT AND TRADEMARK OFFICE
CERTIFICATE OF CORRECTION

PATENT NO. : 11,993,977 B2
APPLICATION NO. : 17/831659
DATED : May 28, 2024
INVENTOR(S) : Daniel Brian Glover et al.

Page 1 of 1

It is certified that error appears in the above-identified patent and that said Letters Patent is hereby corrected as shown below:

In the Claims

In Column 25, Claim 17, Line 10, "13" should be removed

Signed and Sealed this
Seventeenth Day of December, 2024

Derrick Brent
*Acting Director of the United States Patent and Trademark Office*